US012733451B2

(12) United States Patent
Taniguchi et al.

(10) Patent No.: US 12,733,451 B2

(45) Date of Patent: Sep. 8, 2026

(54) SUBSTRATE PROCESSING APPARATUS

(71) Applicant: SCREEN Holdings Co., Ltd., Kyoto (JP)

(72) Inventors: Shinichi Taniguchi, Kyoto (JP); Akihiro Iwasaki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 18/737,446

(22) Filed: Jun. 7, 2024

(65) Prior Publication Data

US 2024/0413001 A1 Dec. 12, 2024

(30) Foreign Application Priority Data

Jun. 8, 2023 (JP) ................................ 2023-094826

(51) Int. Cl.

*H01L 21/687* (2006.01)

*B08B 3/04* (2006.01)

(Continued)

(52) U.S. Cl.

CPC ............ *H10P 72/7618* (2026.01); *B08B 3/04* (2013.01); *H10P 72/0416* (2026.01); *H10P 72/7621* (2026.01); *H10P 72/3412* (2026.01)

(58) Field of Classification Search

CPC ................ B08B 3/04; H01L 21/68771; H01L 21/67781; H01L 21/67057;

(Continued)

(56) References Cited

U.S. PATENT DOCUMENTS

2002/0037207 A1* 3/2002 Yamasaki ......... H01L 21/67781 414/222.01

2003/0164179 A1* 9/2003 Kamikawa ........ H01L 21/67781 134/25.4

(Continued)

FOREIGN PATENT DOCUMENTS

CN 1805126 A 7/2006

CN 107887297 A 4/2018

(Continued)

OTHER PUBLICATIONS

Machine Translation of JP 2022-178486 A to Takahashi, Dec. 2022. (Year: 2022).*

(Continued)

*Primary Examiner* — Benjamin L Osterhout

(74) *Attorney, Agent, or Firm* — OSTROLENK FABER LLP

(57) ABSTRACT

A substrate processing apparatus, the apparatus including: a batch type processing unit; a single wafer type processing unit; a posture turning unit; a first transport unit that transports the plurality of substrates processed by the batch type processing unit to the posture turning unit; and a second transport unit that transports the plurality of substrates brought into a horizontal posture by the posture turning unit to the single wafer type processing unit, in which the posture turning unit holds the plurality of substrates in a state where an interval above upper surfaces of the plurality of substrates is narrow when turning a posture of the plurality of substrates, and holds the plurality of substrates in a state where an interval above upper surfaces of the plurality of substrates is wide when transferring the plurality of substrates after the plurality of substrates are brought into a horizontal posture.

10 Claims, 27 Drawing Sheets

(51) Int. Cl.

| | |
|---|---|
| ***H01L 21/67*** | (2006.01) |
| ***H10P 72/00*** | (2026.01) |
| ***H10P 72/76*** | (2026.01) |
| *H10P 72/30* | (2026.01) |

(58) Field of Classification Search

CPC ........... H01L 21/68764; H10P 72/7618; H10P 72/0416; H10P 72/3412; H10P 72/7621

See application file for complete search history.

(56) References Cited

U.S. PATENT DOCUMENTS

| | | | | |
|---|---|---|---|---|
| 2003/0172955 | A1 | 9/2003 | Kuroda et al. | 134/2 |
| 2006/0137726 | A1 | 6/2006 | Sano et al. | 134/61 |
| 2010/0068014 | A1 | 3/2010 | Mitsuyoshi et al. | 414/225.01 |
| 2012/0006726 | A1 | 1/2012 | Kusuhara et al. | 209/3.1 |
| 2012/0308346 | A1* | 12/2012 | Keigler | H01L 21/68<br>414/222.09 |
| 2014/0093337 | A1* | 4/2014 | Hayashi | B65G 49/00<br>414/225.01 |
| 2015/0131088 | A1 | 5/2015 | Shinohara et al. | |
| 2015/0279721 | A1 | 10/2015 | Kikumoto et al. | |
| 2015/0332940 | A1 | 11/2015 | Wang et al. | |
| 2018/0090360 | A1 | 3/2018 | Miyamoto | |
| 2019/0096729 | A1 | 3/2019 | Muramoto | |
| 2020/0203193 | A1 | 6/2020 | Nam et al. | |
| 2021/0111054 | A1 | 4/2021 | Kanagawa et al. | |
| 2022/0172966 | A1 | 6/2022 | Choi et al. | |
| 2023/0096569 | A1 | 3/2023 | Choi et al. | |
| 2023/0098810 | A1 | 3/2023 | Suzuki et al. | |
| 2024/0234189 | A1 | 7/2024 | Takahashi | |

FOREIGN PATENT DOCUMENTS

| | | | | |
|---|---|---|---|---|
| CN | 114078726 | A | 2/2022 | |
| JP | H10-34061 | A | 2/1998 | |
| JP | 2003-282514 | A | 10/2003 | |
| JP | 2010-093230 | A | 4/2010 | |
| JP | 2015-188010 | A | 10/2015 | |
| JP | 2016-502275 | A | 1/2016 | |
| JP | 2019-061996 | A | 4/2019 | |
| JP | 2022-087065 | A | 6/2022 | |
| JP | 2022-171173 | A | 11/2022 | |
| JP | 2022-178486 | A | 12/2022 | |
| JP | 2023-046537 | A | 4/2023 | |
| KR | 10-2003-0065388 | A | 8/2003 | |
| WO | WO 2010-082567 | A1 | 7/2010 | |
| WO | WO 2013/187090 | A1 | 12/2013 | |
| WO | WO-2022230805 | A1 * | 11/2022 | H01L 21/304 |
| WO | WO-2022244745 | A1 * | 11/2022 | H01L 21/304 |

OTHER PUBLICATIONS

Office Action dated Aug. 7, 2025 for corresponding Japanese Patent Application No. 2023-094826.

Notice of Allowance dated May 28, 2026 for corresponding Korean Patent Application No. 10-2024-0068455.

Office Action dated May 5, 2026 for corresponding Taiwanese Patent Application No. 113121209.

Notice of Allowance dated May 13, 2026 for corresponding Chinese Patent Application No. 202410737083.6.

* cited by examiner

1
X(FRONT)
X(BACK)
Y(RIGHT)
Y(LEFT)
Z
3
5
7
9
11
13
15
17
19
81
83
85
A
TW1
TW2
TW3
TW4
MPC
CR
IR
BR
95
93
91
89
71
87
W
C
ACB
CTC
HTR
HVC
WTR
TFC
PH
LF0
LF
BB
BPU
BPU1
BPU2
BPU3
BPU4
BPU5
BPU6
21
23
25
27
31
33
35

33
41
AX2
AX2
63
63b
63b
63
63a
63a
67
67
67b
67b
67a
65
61
61
67a
65
45
43
W
45
61b
61b
65a
65a
AX1
AX1
65b
65b
67c
67c
61a
61a
67d
67d
DB

Y(RIGHT)
Y(LEFT)
Z
X
Z
3
7
BR
71
HP1
15
41
33
67c
P3
DB
43
35
TFC
W
67c
31
BB0
W
LF0
WTR

Y(RIGHT)
Y(LEFT)
Z
Z
X
7
BR
71
15
41
33
67
67c
67c
43
W
DB
31
P2
35
TFC
LFO
W
BBO
WTR
67c
67c
67c
67c
43
43
W

Y (RIGHT)
Y (LEFT)
Z
Z
X
7
BR
67c
67c
67c
67c
43
43
71
W
15
41
33
67c
67
DB
43
67c
W
71
31
P2
35
TFC
W
LF0
BB0
WTR

Y (RIGHT)
Y (LEFT)
Z
Z
X
7
BR
71
W
15
41
33
67c
67
43
W
67c
DB
31
P2
35
TFC
LFO
W
BBO
WTR

Y (RIGHT)
Y (LEFT)
Z
Z
X
7
BR
71
W
15
41
33
67
67c
67c
43
W
DB
31
P2
35
TFC
LFO
W
BBO
WTR

SUBSTRATE PROCESSING APPARATUS

BACKGROUND OF THE INVENTION

(1) Field of the Invention

The present invention relates to a substrate processing apparatus that performs predetermined processing on a substrate such as a semiconductor substrate, a substrate for a flat panel display (FPD) such as a liquid crystal display or an organic electroluminescence (EL) display device, a glass substrate for a photomask, or a substrate for an optical disk.

(2) Description of the Related Art

Conventionally, this type of apparatus includes a batch type module, a single wafer type module, and a rotating mechanism. For example, JP 2016-502275 A is referred to. The batch type module collectively processes a plurality of substrates. The single wafer type module performs processing on each substrate. In general, the drying processing by the single wafer type module has a small space of a processing atmosphere in which the substrate is affected and high particle performance as compared with the drying processing by the batch type module. Therefore, the single wafer type module is more likely to enhance the drying performance than the batch type module. Therefore, for example, the etching processing and the rinsing processing may be performed by the batch type module, and then the drying processing may be performed by the single wafer type module.

In the batch type module, processing is performed in a state in which plurality of substrates are in a vertical posture. On the other hand, in the single wafer type module, the processing is performed in a state where the substrate is in a horizontal posture. Therefore, the substrate in the vertical posture that has been processed by the batch type module is turned to the horizontal posture by the rotating mechanism before being transported to the single wafer type module. The rotating mechanism includes an reversing chuck in which a groove for cramping the substrate is formed.

Specifically, the groove of the reversing chuck includes a guide groove on the front side and a locking groove on the back side. The guide groove is formed in a V shape for guiding the peripheral edge of the substrate. The locking groove has a shape in which the thickness is slightly larger than the thickness of the substrate so as to prevent the substrate from greatly moving in the thickness direction and lock the end surface of the substrate. As a result, when the reversing chuck clamps the substrate, the peripheral edge of the substrate is guided to the guide groove, and the end surface of the substrate is gripped by the locking groove. Therefore, the rotation of the substrate can be stably performed.

However, the conventional example having such a configuration has the following problems.

That is, in the conventional apparatus, the distance over which the substrate positioned in the locking groove of the reversing chuck can be moved up is very short. Therefore, although the posture can be stably turned, there is a problem that it is difficult to control the hand that receives the substrate in the horizontal posture.

SUMMARY OF THE INVENTION

The present invention has been made in view of such circumstances, and an object of the present invention is to provide a substrate processing apparatus capable of easily transferring a substrate while performing a stable posture turn by providing an interval within which the substrate can be sufficiently moved up at the time of transferring the substrate.

In order to achieve such an object, the present invention has the following configuration.

That is, the present invention is a substrate processing apparatus that processes a substrate, the apparatus including the following elements: a batch type processing unit that collectively processes a plurality of substrates in a vertical posture; a single wafer type processing unit that processes one substrate in a horizontal posture; a posture turning unit that turns the vertical posture to the horizontal posture of the plurality of substrates processed by the batch type processing unit; a first transport unit that transports the plurality of substrates processed by the batch type processing unit to the posture turning unit; and a second transport unit that transports the plurality of substrates brought into a horizontal posture by the posture turning unit to the single wafer type processing unit, in which the posture turning unit holds the plurality of substrates in a state where an interval above upper surfaces of the plurality of substrates is narrow when turning a posture of the plurality of substrates, and holds the plurality of substrates in a state where an interval above upper surfaces of the plurality of substrates is wide when transferring the plurality of substrates after the plurality of substrates are brought into a horizontal posture.

According to the present invention, the plurality of substrates processed by the batch type processing unit are transported to the posture turning unit by the first transport unit, and then turned from the vertical posture to the horizontal posture by the posture turning unit. The plurality of substrates turned to the horizontal posture are transferred one by one by the second transport unit, and then processed by the single wafer type processing unit. When the posture turning unit turns the posture of the plurality of substrates, the posture turning unit holds the plurality of substrates in a state where an interval above the upper surface of the plurality of substrates is narrow. Therefore, the plurality of substrates can be stably held, and the posture can be stably turned. When transferring the plurality of substrates in the horizontal posture, the posture turning unit holds the plurality of substrates in a state in which an interval above the upper surface of the plurality of substrates is wide. Therefore, the second transport unit can easily transfer each of the plurality of substrates.

Further, in the present invention, it is preferable that the posture turning unit includes: an reversing chuck that is disposed to face each other in a radial direction of the plurality of substrates and clamps peripheral edge portions of the plurality of substrates; a drive mechanism that moves the reversing chuck in a horizontal direction over at least two positions of a first interval for transferring the plurality of substrates between the first transport unit and the second transport unit and a second interval that is narrower than the first interval and where the plurality of substrates are clamped; and a rotating mechanism that rotates the reversing chuck in a plane direction of the plurality of substrates, and the reversing chuck includes: a first groove that allows the plurality of substrates to move in a thickness direction; and a second groove formed on an outer side of the plurality of substrates than the first groove and clamps the plurality of substrates in a radial direction while restricting movement of the plurality of substrates in a thickness direction, when the reversing chuck receives the plurality of substrates from the first transport unit, the reversing chuck is set to the first interval by the drive mechanism so that each of the plurality of substrates is accommodated in the first groove, when the plurality of substrates are rotated in a horizontal posture by the rotating mechanism, the reversing chuck is set to the second interval by the drive mechanism so that each of the plurality of substrates is clamped in the second groove, and when the second transport unit receives the plurality of substrates from the reversing chuck, the reversing chuck is set to the first interval by the drive mechanism so that the lower surfaces of the plurality of substrates are abutted and supported by the first groove.

When the reversing chuck receives the plurality of substrates from the first transport unit, the reversing chuck is set to the first interval by the drive mechanism so that each of the plurality of substrates is accommodated in the first groove. When the plurality of substrates are rotated in the horizontal posture by the rotating mechanism, the reversing chuck is set to the second interval by the drive mechanism so that each of the plurality of substrates is clamped between the second groove. Therefore, movement of the substrates in the thickness direction are restricted when turning the posture. As a result, the plurality of substrates can be stably held, and the posture can be stably turned. When the second transport unit receives the plurality of substrates from the reversing chuck, the reversing chuck is set to the first interval by the drive mechanism so that the lower surfaces of the plurality of substrates are abutted and supported by the first groove. Therefore, when transferring the substrates, the substrates are allowed to move in the thickness direction. As a result, the second transport unit can scoop up and easily transfer each of the plurality of substrates. The posture turning unit can clamp or loosely hold the substrate only by moving the reversing chuck in the horizontal direction by the drive mechanism.

In addition, in the present invention, it is preferable that the second groove includes a top portion where end surfaces of the plurality of substrates are positioned, and a depth-side inclined surface that widens from the top portion toward a center side of the plurality of substrates, and the first groove has an opening on the center side of the plurality of substrates, and has a front-side inclined surface that widens from the depth-side inclined surface toward the opening.

In the reversing chuck, two-stage grooves of the first groove and the second groove are formed. The second groove holds the end surface of the substrate at the top portion and supports the lower surface of the substrate at the depth-side inclined surface. Therefore, the substrate can be stably clamped. The first groove continuing from the second groove abuts and supports the lower surface of the substrate at a front-side inclined surface that widens toward the opening. Therefore, a sufficient interval can be formed on the upper surface of the substrate.

In addition, in the present invention, it is preferable that the depth-side inclined surface and the front-side inclined surface have inclined surfaces at positions facing front and back surfaces of the plurality of substrates.

In a substrate processing apparatus, a lot including a plurality of substrates with surfaces of the substrates facing each other may be processed (so-called face to face). When such a lot is processed, a plurality of substrates whose surfaces are oriented in a predetermined direction are held by the reversing chuck and reversed, or a plurality of substrates whose surfaces are oriented in a direction opposite to the predetermined direction are held by the reversing chuck and reversed in a direction opposite to the substrate whose surfaces are oriented in the predetermined direction. Thereafter, the lower surface of the substrate slides on the depth-side inclined surface and is abutted and supported by the front-side inclined surface. Therefore, even a plurality of substrates whose surfaces are directed in any direction can be reliably moved from the depth-side inclined surface to the front-side inclined surface and abutted and supported by the front-side inclined surface.

Further, in the present invention, it is preferable that the front-side inclined surface is inclined more gently than the depth-side inclined surface.

When the reversing chuck is set from the second interval to the first interval, the substrate is moved from the depth-side inclined surface to the front-side inclined surface. At this time, since the impact applied to the lower surface of the substrate can be reduced, generation of particles when the interval is turned from the second interval to the first interval can be suppressed.

Further, in the present invention, it is preferable that the posture turning unit further includes an alignment bar movable between a restricting position where the movement of the plurality of substrates in the horizontal direction is restricted and an allowing position where the movement of the plurality of substrates in the horizontal direction is allowed in a state where the plurality of substrates are brought into the horizontal posture by the reversing chuck, and the posture turning unit moves the alignment bar to the restricting position until the reversing chuck is expanded from the second interval to the first interval.

The alignment bar is moved to the restricting position until the reversing chuck is expanded from the second interval to the first interval. Therefore, when the reversing chuck moves, it is possible to prevent the plurality of substrates from being displaced in the horizontal direction. As a result, upon transferring by the second transport unit, the substrate can be reliably transferred.

In the present invention, it is preferable that the alignment bar is provided at a side where the second transport unit receives the plurality of substrates and at an opposite side of the receiving side with the plurality of substrates interposed therebetween in plan view.

It is possible to restrict the horizontal position of the substrate at the side where the second transport unit moves forward and backward. Therefore, the front and back positions of the substrate can be restricted as viewed from the second transport unit. As a result, when the second transport unit transfers the substrate, the substrate can be reliably transferred.

Further, in the present invention, it is preferable that when the second transport unit receives the plurality of substrates from the reversing chuck after the reversing chuck has been expanded from the second interval to the first interval, the alignment bar at the receiving side among the alignment bars moves to the allowing position.

After the alignment bar at the receiving side among the alignment bars is moved to the allowing position, the substrate is transferred by the second transport unit. Therefore, the second transport unit can smoothly transfer the substrate. Further, in the present invention, it is preferable that the alignment bar is formed with a plurality of grooves corresponding to positions of end surfaces of the plurality of substrates.

When the reversing chuck is moved from the second interval to the first interval, the plurality of substrates move downward from the depth-side inclined surface toward the front-side inclined surface. At that time, it is possible to suppress generation of particles due to sliding of the end surfaces of the plurality of substrates while restricting large movement in the horizontal direction.

In the present invention, it is preferable that a lifting mechanism that moves up and down the reversing chuck is further provided, and when the second transport unit receives the plurality of substrates from the reversing chuck, the second transport unit moves down the reversing chuck by the lifting mechanism.

The substrate can be transferred to the second transport unit by moving down the reversing chuck by the lifting mechanism without moving up and down the second transport unit. Therefore, the configuration of the second transport unit can be simplified.

Further, in the present invention, it is preferable that when the first transport unit transfers the plurality of substrates to the reversing chuck, the lifting mechanism moves down the reversing chuck that has been set to the first interval from a receiving height in the vicinity of an upper edge of the plurality of substrates transported by the first transport unit to a clamping height in the vicinity of a side edge of the plurality of substrates.

When the lifting mechanism moves down the reversing chuck that has been set to the first interval from the receiving height to the clamping height, the plurality of substrates can be transferred to the reversing chuck. Therefore, it is possible to transfer a plurality of substrates with simple control.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Hereinafter, preferred embodiments of the present invention will be described in detail with reference to the drawings.

Figure 1:
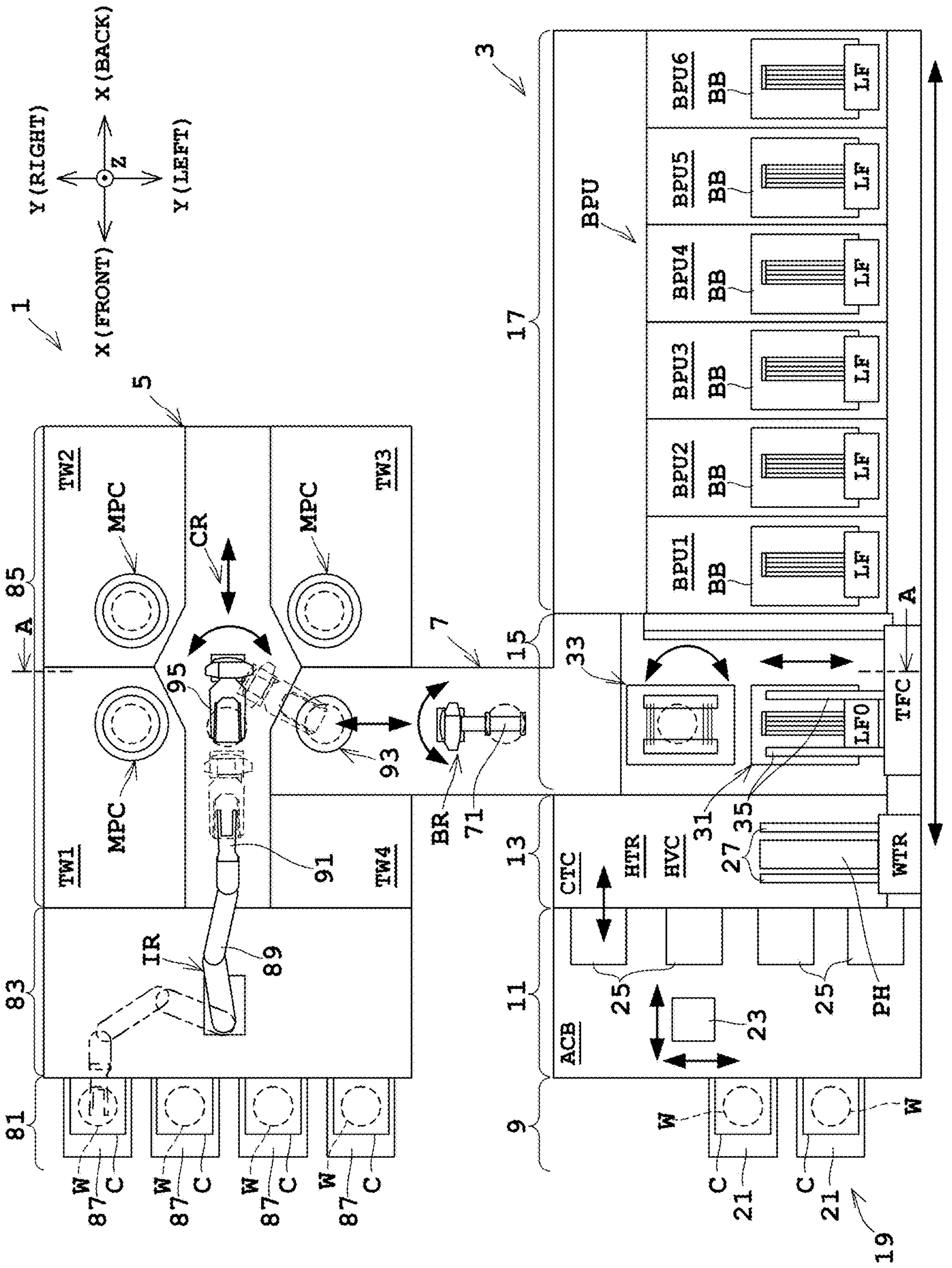
FIG. 1 is a plan view showing an overall configuration of a substrate processing apparatus according to an embodiment.
Figure 2:
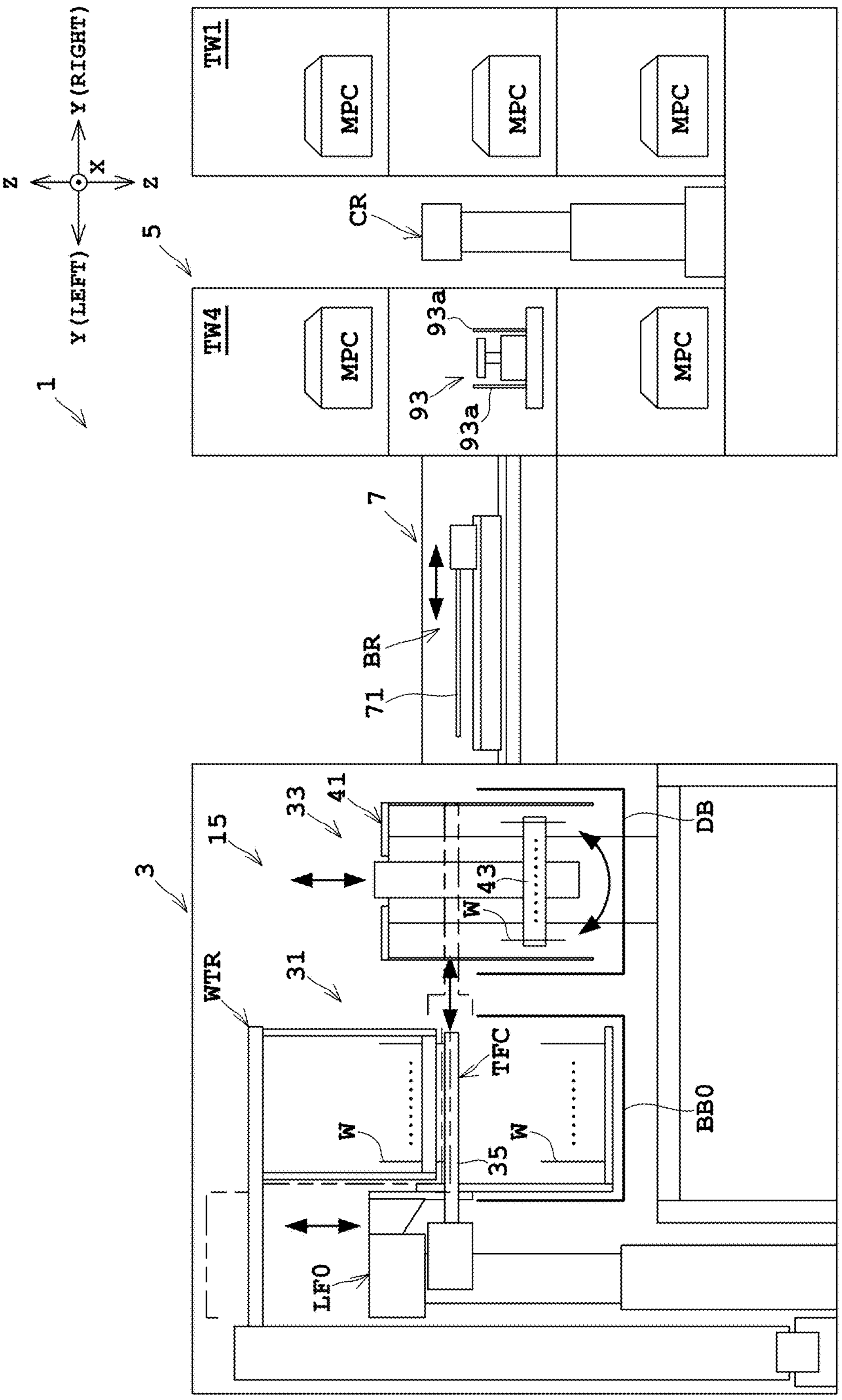
FIG. 2 is a cross-sectional view taken along line A-A in FIG. 1.

FIG. 1 is a plan view showing an overall configuration of a substrate processing apparatus according to an embodiment. FIG. 2 is a cross-sectional view taken along line A-A in FIG. 1.

1. Overall Configuration

A substrate processing apparatus 1 processes a substrate W. The substrate processing apparatus 1 performs, for example, chemical liquid processing, cleaning processing, drying processing, and the like on the substrate W. The substrate processing apparatus 1 adopts a processing method (so-called hybrid method) having both a batch type and a single wafer type. The batch type collectively processes a plurality of substrates W in a vertical posture. The single wafer type processes one substrate W in a horizontal posture.

The substrate processing apparatus 1 includes a batch type processing apparatus 3 and a single wafer type processing apparatus 5. In the present embodiment, the single wafer type processing apparatus 5 is disposed adjacent to the batch type processing apparatus 3. The batch type processing apparatus 3 and the single wafer type processing apparatus 5 are disposed apart from each other. The batch type processing apparatus 3 and the single wafer type processing apparatus 5 are coupled by a bridging unit 7.

2. Batch Type Processing Apparatus

The batch type processing apparatus 3 collectively processes a plurality of substrates W. The batch type processing apparatus 3 includes a loading block 9, a stocker block 11, a transfer block 13, a posture turning block 15, and a processing block 17.

In the present specification, for convenience, a direction in which the loading block 9, the stocker block 11, the transfer block 13, and the processing block 17 are arranged is referred to as a "front-back direction X". The front-back direction is horizontal. Of the front-back direction X, the direction from the stocker block 11 toward the loading block 9 is referred to as "front side". A direction opposite to the front side is referred to as "back side". A horizontal direction orthogonal to the front-back direction X is referred to as a "width direction Y". One direction in the "width direction Y" is appropriately referred to as a "right side". A direction opposite to the right side is referred to as "left side". A direction perpendicular to the horizontal direction is referred to as a "vertical direction Z". In each drawing, front, back, upper, lower, right, and left are appropriately shown for reference.

3. Loading Block

The loading block 9 includes a charging unit 19. The charging unit 19 is disposed at the front side X of the batch type processing apparatus 3. A carrier C stacks and stores the plurality of (for example, 25-sheets) substrates W in the vertical direction Z at constant intervals in the horizontal posture. In the carrier C, a plurality of grooves (not illustrated) for accommodating the substrates W one by one are formed with the surfaces of the substrates W separated from each other. As the carrier C, for example, there is a front opening unify pod (FOUP). The FOUP is a sealed container. The carrier C may be an open type container and may be of any type. The charging unit 19 includes, for example, two placing tables 21 on which the carrier C is placed. The two placing tables 21 are arranged, for example, along the width direction Y. The charging unit 19 is also referred to as a load port.

4. Stocker Block

The stocker block 11 is disposed adjacent to the back side X of the loading block 9. The stocker block 11 includes a transport storage unit ACB. The transport storage unit ACB includes a transport mechanism 23 and a shelf 25.

The transport mechanism 23 transports the carrier C. The transport storage unit ACB includes a plurality of shelves 25. The shelf 25 includes one on which the carrier C is simply temporarily placed and one on which the carrier C is placed for transfer between a first transport mechanism HTR. The transport storage unit ACB takes in the carrier C storing the unprocessed substrate W from the charging unit 19 and places the carrier C on the shelf 25. The transport storage unit ACB transports and places the carrier C on the transfer shelf 25 according to the schedule that defines the order of processing. The transport storage unit ACB transports and places the carrier C, which has been placed on the transfer shelf 25 and has become empty, on the shelf 25. The transport storage unit ACB carries out the empty carrier C placed on the shelf 25 to the placing table 21 according to the availability of the placing table 21. The empty carrier C is transported to the single wafer type processing unit 5. In the empty carrier C transported to the single wafer type processing unit 5, for example, the substrate W that has been stored in the carrier C before processing and has been processed is stored in the single wafer type processing unit 5.

5. Transfer Block

The transfer block 13 is disposed adjacent to the back side X of the stocker block 11. The transfer block 13 includes a transfer mechanism CTC. The transfer mechanism CTC includes the first transport mechanism HTR, a turning mechanism HVC, a pusher PH, and a second transport mechanism WTR.

The first transport mechanism HTR is disposed at the right side Y of the back side X of the transport storage unit ACB. The first transport mechanism HTR collectively transports the plurality of substrates W. In other words, the first transport mechanism HTR includes a plurality of hands (not illustrated). One hand supports one substrate W. The first transport mechanism HTR can also convey only one substrate W. The first transport mechanism HTR collectively takes out a plurality of substrates W (for example, 25-sheets) from the carrier C placed on the transfer shelf 25 in the transport storage unit ACB, and transports the substrates W to the turning mechanism HVC in the horizontal posture. At this time, the turning mechanism HVC orientates the posture of the substrate W from the horizontal posture to the vertical posture.

The turning mechanism HVC and the pusher PH are sequentially arranged in the left side Y of the first transport mechanism HTR. The turning mechanism HVC transfers the plurality of substrates W to the pusher PH. After receiving the plurality of substrates W from the turning mechanism HVC, the pusher PH moves to the second transport mechanism WTR in the width direction Y. At that time, the turning mechanism HVC and the pusher PH assemble a batch lot or release a batch lot. The pusher PH transfers the plurality of substrates W to the second transport mechanism WTR.

For example, the transfer mechanism CTC combines the plurality of substrates W constituting one lot extracted from one carrier C and the plurality of substrates W constituting another lot extracted from another carrier C as one batch lot. This is the assembly of the batch lot. The batch lot includes twice as many substrates W as one lot. In the batch lot, each substrate W of another lot is arranged so as to be adjacent to each substrate W of one lot. That is, each substrate W of one lot is arranged in odd-numbered order, and each substrate W of the other one lot is arranged in even-numbered order. Usually, the interval between the plurality of substrates W extracted from the carrier C is the same as that of the carrier C. This is called full pitch. In one batch lot, for example, the interval between the plurality of substrates W is half the full pitch. This is called half pitch. One lot and the other lot are combined as described above, but there are two types of batch lots, that is, surface matching (also referred to as face to face) and front and back surface matching (also referred to as back to face) depending on how they are combined. How to combine the lots is determined by the operation of the pusher PH. Note that details of this operation will be omitted in order to facilitate understanding of the present invention. In the following description, the plurality of substrates W are referred to as a lot, but in a case where a description unique to a batch lot is required, the plurality of substrates W are referred to as a batch lot.

The second transport mechanism WTR is disposed at the left side Y of the transfer mechanism CTC. The second transport mechanism WTR is configured to be movable between the transfer block 13 and the processing block 17. The second transport mechanism WTR is configured to be movable in the front-back direction X. The second transport mechanism WTR includes a pair of hands 27 that transports a lot. The pair of hands 27 includes, for example, a rotating shaft oriented in the width direction Y. The pair of hands 27 swings around the rotating shaft. The pair of hands 27 clamps the side end surfaces located in the front-back direction X of the plurality of substrates W constituting the lot. The second transport mechanism WTR transfers the plurality of substrates W constituting the lot between the transfer mechanism CTC. The second transport mechanism WTR transfers a plurality of unprocessed substrates W constituting a lot to the processing block 17. The second transport mechanism WTR transfers the plurality of substrates W processed in the processing block 17 between the posture turning block 15.

Here, the processing block 17 will be described before describing the posture turning block 15.

6. Processing Block

The processing block 17 includes, for example, a batch processing unit BPU. For example, the batch processing unit BPU includes six processing units. Specifically, the batch processing unit BPU includes a first batch processing unit BPU1, a second batch processing unit BPU2, a third batch processing unit BPU3, a fourth batch processing unit BPU4, a fifth batch processing unit BPU5, and a sixth batch processing unit BPU6. The number of the batch processing units BPU is not limited to six. That is, the number of batch processing units BPU may be less than six, or may be seven or more.

The first batch processing unit BPU1 to the sixth batch processing unit BPU6 are arranged in a line in the front-back direction X. Each of the first batch processing unit BPU1 to the sixth batch processing unit BPU6 includes a processing tank BB and a lifter LF. The processing tank BB stores the processing liquid. The processing liquid is pure water or a chemical liquid. The chemical liquid is, for example, an organic solvent or an etching liquid. The organic solvent is, for example, isopropyl alcohol (IPA). The etching solution is, for example, a phosphoric acid solution.

The lifter LF moves up and down between a processing position inside the processing tank BB and a transfer position above the liquid level of the processing tank BB. The lifter LF transfers the plurality of substrates W to the second transport mechanism WTR at the transfer position. The first batch processing unit BPU1 to the sixth batch processing unit BPU6 are associated with each pair, for example. Specifically, the first batch processing unit BPU1 and the second batch processing unit BPU2 form one pair, the third batch processing unit BPU3 and the fourth batch processing unit BPU4 form one pair, and the fifth batch processing unit BPU5 and the sixth batch processing unit BPU6 form one pair. For example, one pair is divided into a role of chemical liquid processing and a role of cleaning processing. The first batch processing unit BPU1 to the sixth batch processing unit BPU6 can collectively process, for example, up to fifty substrates W. In other words, the first batch processing unit BPU1 to the sixth batch processing unit BPU6 can simultaneously process, for example, at most one batch lot.

The processing liquid is supplied from below to each processing tank BB. In each processing tank BB, the processing liquid is discharged beyond the upper edge. Each processing tank BB immerses the plurality of substrates W placed on the lifter LF in the processing liquid. Each lifter LF holds the lower edge of the substrate W in contact with the lower edge. Each lifter LF transfers a plurality of substrates W between the second transport mechanism WTR.

7. Posture Turning Block

As illustrated in FIG. 2, the posture turning block 15 includes a 25-piece chuck TFC, a standby tank 31, and a posture turning tank 33. In the drawings being referred for the standby tank 31 and the posture turning tank 33, the liquid level is not illustrated so that each configuration can be easily seen.

The standby tank 31 includes a processing tank BB0 and a lifter LF0. The processing tank BB0 has the same configuration as the processing tank BB provided in the first batch processing unit BPU1 to the sixth batch processing unit BPU6 described above. The lifter LF0 moves up and down between a standby position inside the processing tank BB0 and a transfer position above the liquid level of the processing tank BB0. The standby tank BB0 stores the processing liquid. The processing liquid is, for example, pure water. At the standby position, the entire substrate W placed on the lifter LF0 is immersed in the processing liquid.

Figure 3:
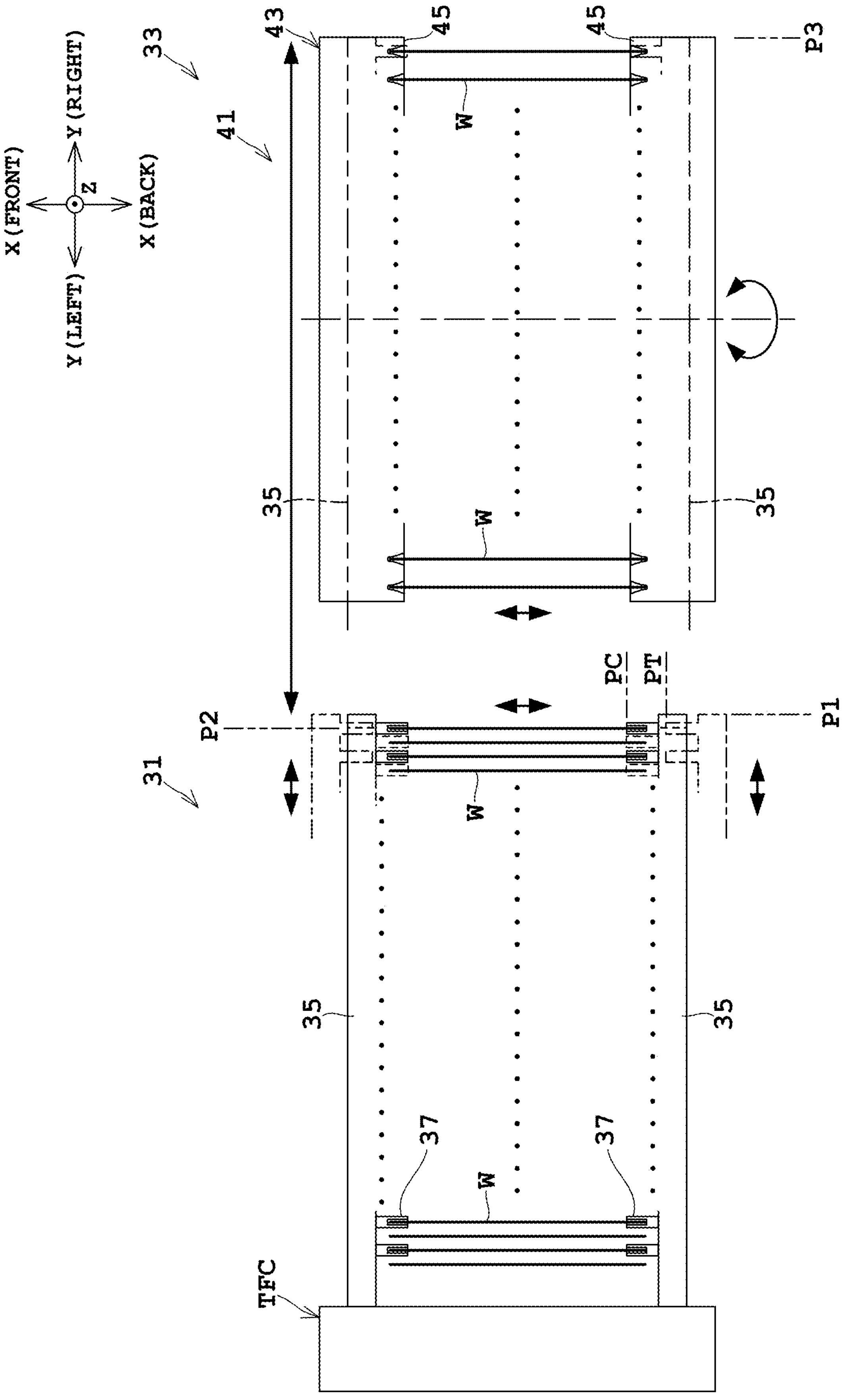
FIG. 3 is a plan view showing a configuration of a 25-piece chuck and an reversing chuck.

Here, refer to FIG. 3. FIG. 3 is a plan view showing a configuration of the 25-piece chuck and the reversing chuck.

The entire 25-piece chuck TFC horizontally moves only in the width direction Y. The 25-piece chuck TFC does not move up and down in the vertical direction Z. The 25-piece chuck TFC does not horizontally move in the front-back direction X. However, the 25-piece chuck TFC opens and closes a hand 35 between a holding position PC and a passing position PT. At the holding position PC, the 25-piece chuck TFC holds the plurality of substrates W. At the passing position PT, the 25-piece chuck TFC does not hold the plurality of substrates W. In other words, the passing position PT allows the lifter LF0 holding the plurality of substrates W to move between the transfer position and the standby position. For example, the 25-piece chuck TFC moves over three positions of a first transfer position P1, a second transfer position P2, and a third transfer position P3 in the width direction Y.

The 25-piece chuck TFC includes locking portions 37. The locking portions 37 are provided inside the hand 35. The locking portions 37 are formed in the width direction Y at intervals of the full pitch described above. The first transfer position P1 and the second transfer position P2 are different in position in the width direction Y by a distance corresponding to a half pitch. The third transfer position P3 is a position where the plurality of substrates W are transferred to the posture turning tank 33. The 25-piece chuck TFC receives only one lot from the lifter LF0 at the first transfer position P1. Specifically, only a plurality of odd numbered substrates W constituting the first lot among two lots constituting the batch lot are received. The 25-piece chuck TFC receives only the other lot from the lifter LF0 at the second transfer position P2. Specifically, only a plurality of even-numbered substrates W constituting the next lot among two lots constituting the batch lot are received.

Figure 4:
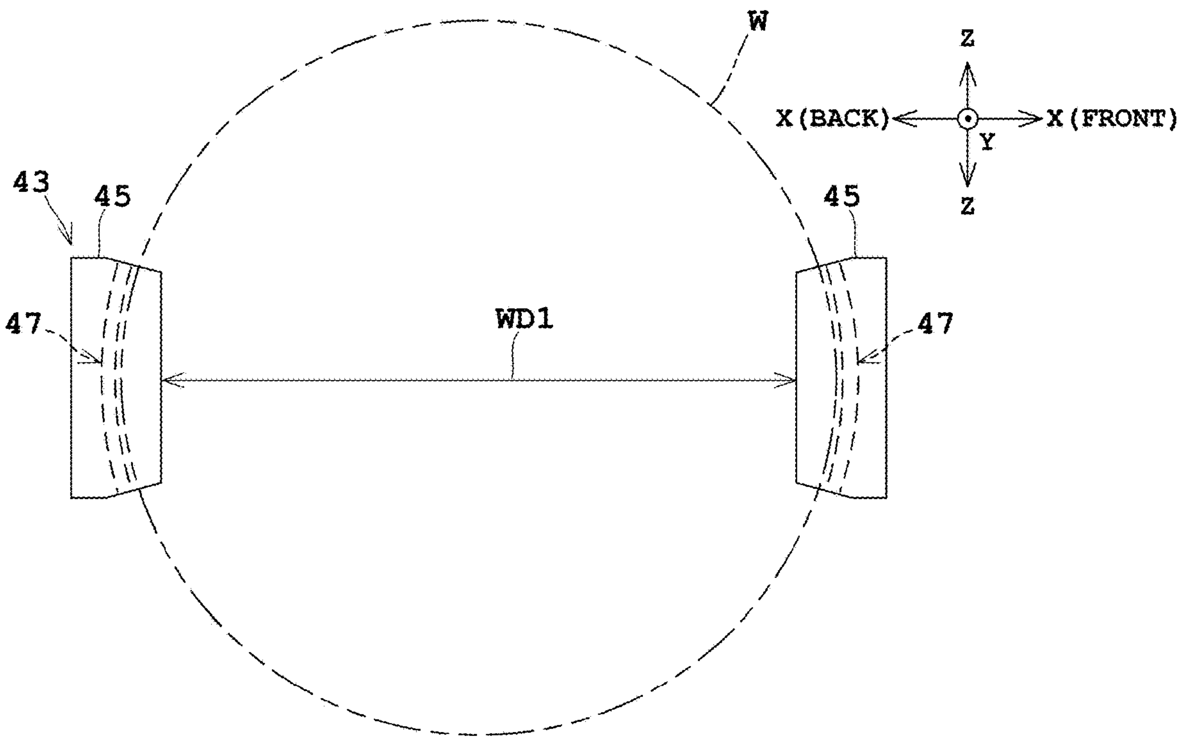
FIG. 4 is a front view in a state where the reversing chuck is set to a first interval.
Figure 5:
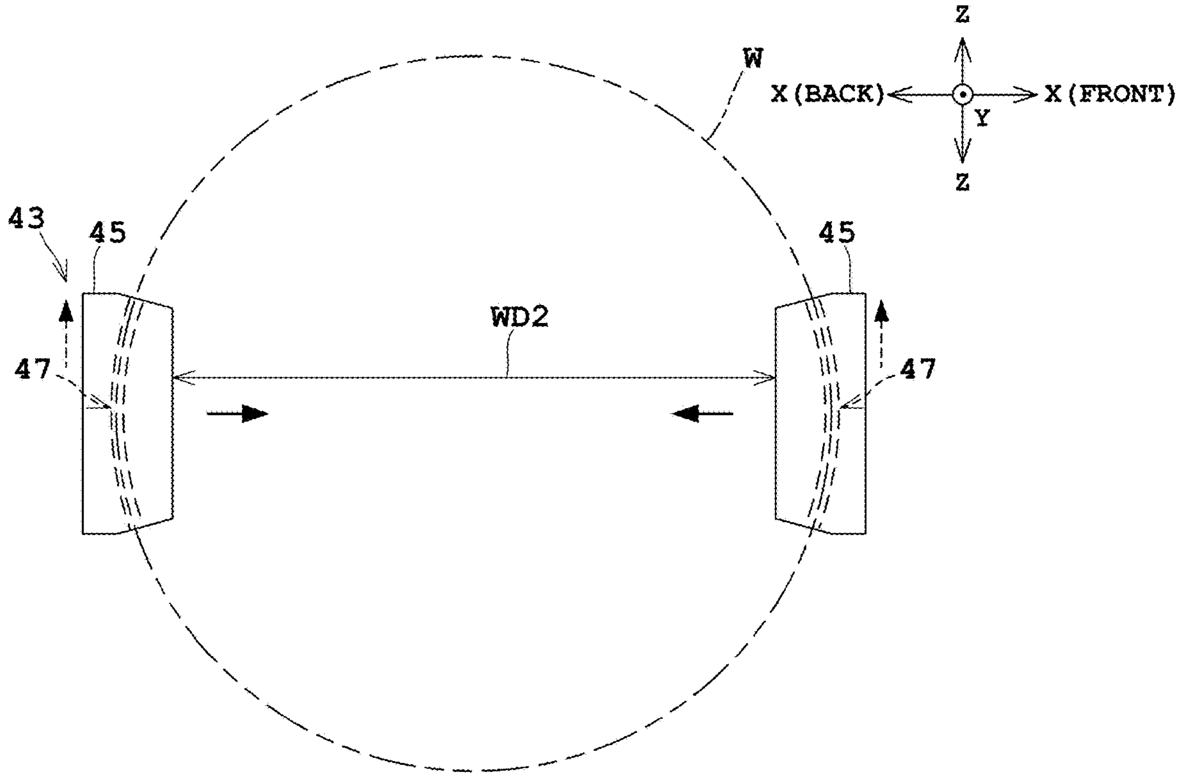
FIG. 5 is a front view in a state where the reversing chuck is set to a second interval.
Figure 6:
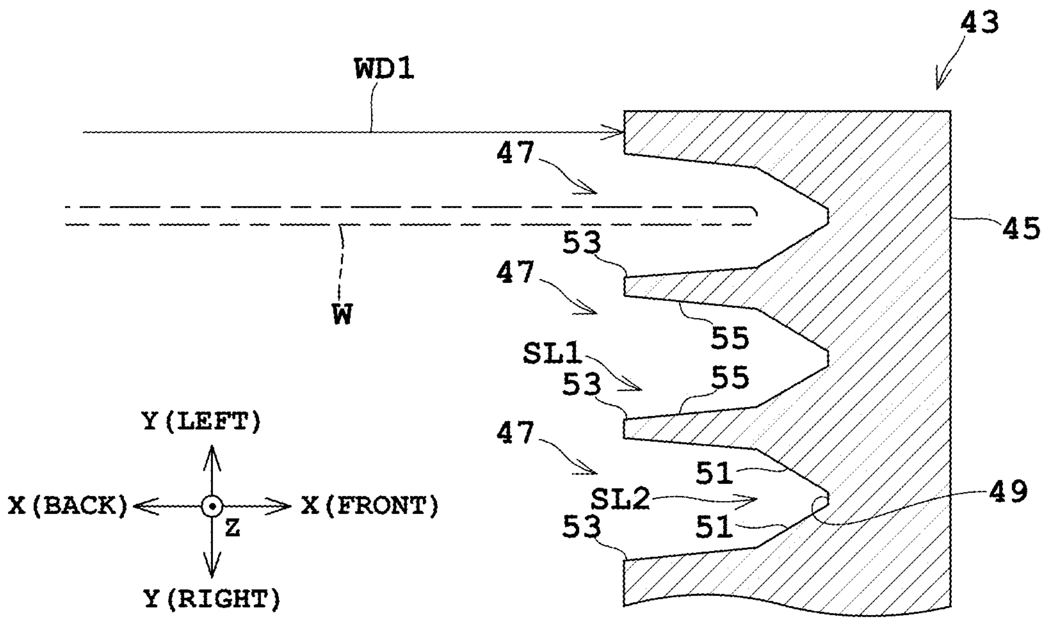
FIG. 6 is a transverse cross-sectional view in a state where the reversing chuck is set to the first interval.
Figure 7:
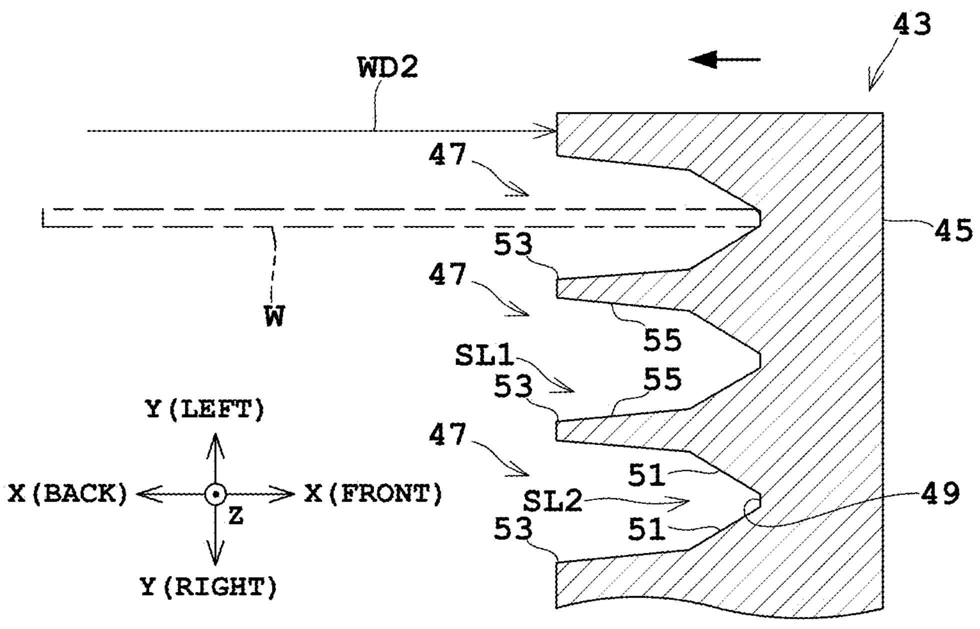
FIG. 7 is a transverse cross-sectional view in a state where the reversing chuck is set to the second interval.

Here, in addition to FIGS. 2 and 3, FIGS. 4 to 7 will be further referred to. FIG. 4 is a front view in a state in which the reversing chuck is set to a first interval. FIG. 5 is a front view in a state where the reversing chuck is set to a second interval. FIG. 6 is a transverse cross-sectional view in a state where the reversing chuck is set to a first interval. FIG. 7 is a transverse cross-sectional view in a state where the reversing chuck is set to a second interval.

As illustrated in FIG. 2, the posture turning tank 33 includes an immersion tank DB and a posture turning unit 41.

First, the main part will be described. The posture turning tank 33 collectively turns the posture of the plurality of substrates W by the reversing chuck 43 in the immersion tank DB. Specifically, the reversing chuck 43 turns the plurality of substrates W from the vertical posture to the horizontal posture. For example, the reversing chuck 43 turns the posture of half of the substrates W constituting the batch lot. For example, the reversing chuck 43 turns the posture of twenty five substrates W. The reversing chuck 43 is disposed to face each other in the radial direction of the substrate W and clamps a peripheral edge portion of the substrate W. The immersion tank DB stores the processing liquid. The processing liquid is, for example, pure water.

As illustrated in FIGS. 4 and 5, the reversing chuck 43 includes a pair of chuck members 45. In the chuck member 45, the length in the vertical direction Z when receiving and holding the substrate W in the vertical posture is shorter than the radius of the substrate W. As illustrated in FIG. 3, in the chuck member 45, the length in the width direction Y when receiving and holding the substrates W in the vertical posture is slightly longer than the length in the alignment direction of the plurality of substrates W in the lot.

As illustrated in FIGS. 4 to 6, each of the chuck members 45 has a groove portion 47 on the opposing surface. As illustrated in FIGS. 4 and 5, the groove portion 47 has an arc shape when viewed from the width direction Y in the vertical posture in which the substrate W in the vertical posture is received and held. The arc shape of the groove portion 47 is a shape along the outer edge of the substrate W.

As illustrated in FIG. 6, the groove portion 47 includes a first groove SL1 and a second groove SL2. The first groove SL1 allows the plurality of substrates W to move in the thickness direction. The second groove SL2 is formed outward of the first groove SL1 in the radial direction of the plurality of substrates W, and clamps the plurality of substrates W in the radial direction while restricting the movement of the plurality of substrates W in the thickness direction.

The second groove SL2 includes a top portion 49 on which the end surfaces of the plurality of substrates W are positioned, and a depth-side inclined surface 51 which expands from the top portion 49 toward the centers of the plurality of substrates W. The top portion 49 is formed at a portion where the two depth-side inclined surfaces 51 are narrowest. The top portion 49 has a size capable of accommodating the end surfaces of the substrates W. The depth-side inclined surface 51 is formed at a position facing the front and back surfaces of the substrates W.

The first groove SL1 has an opening 53 at the center of the plurality of substrates W. The first groove SL1 has a front-side inclined surface 55 that widens from the depth-side inclined surface 51 toward the opening 53. The front-side inclined surface 55 is formed at a position facing the front and back surfaces of the substrates W. The dimension of the opening 53 in the width direction Y is, for example, several times larger than the thickness of the substrate W.

The front-side inclined surface 55 is formed so as to be inclined more gently than the depth-side inclined surface 51. In other words, the depth-side inclined surface 51 is formed such that the inclination toward the top portion 49 is steeper than the front-side inclined surface 55.

The pair of chuck members 45 moves in the front-back direction X across a first interval WD1 and a second interval WD2. The pair of chuck members 45 can change the distance between the groove portions 47 facing each other. The first interval WD1 is an interval for transferring the substrates between the 25-piece chuck TFC and the bridging unit 7. The second interval WD2 is an interval that is narrower in the front-back direction X than the first interval WD1 and is for clamping the plurality of substrates W.

Figure 8:
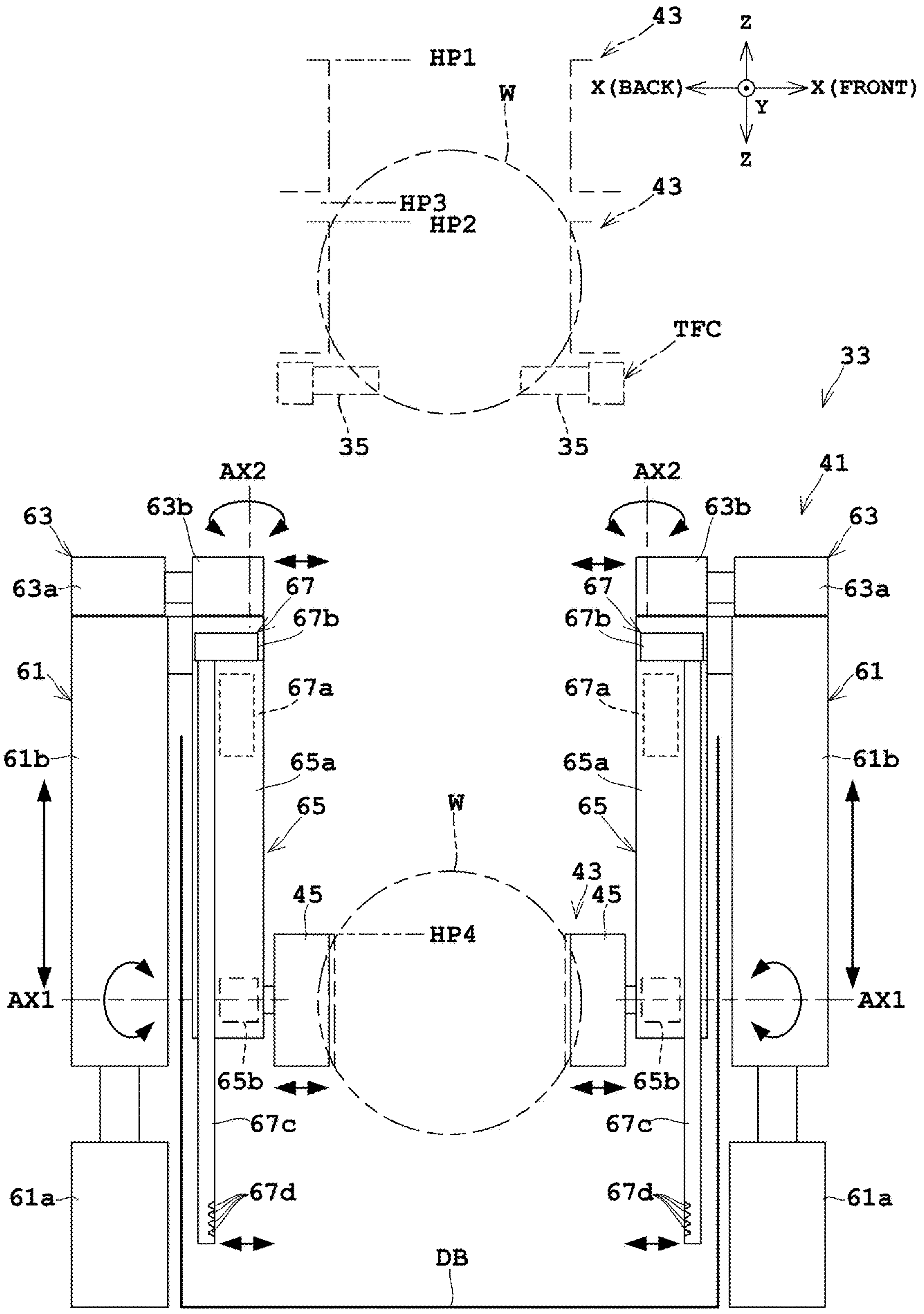
FIG. 8 is a front view illustrating a configuration of a posture turning unit and illustrating a state in which a substrate is held in a vertical posture.
Figure 9:
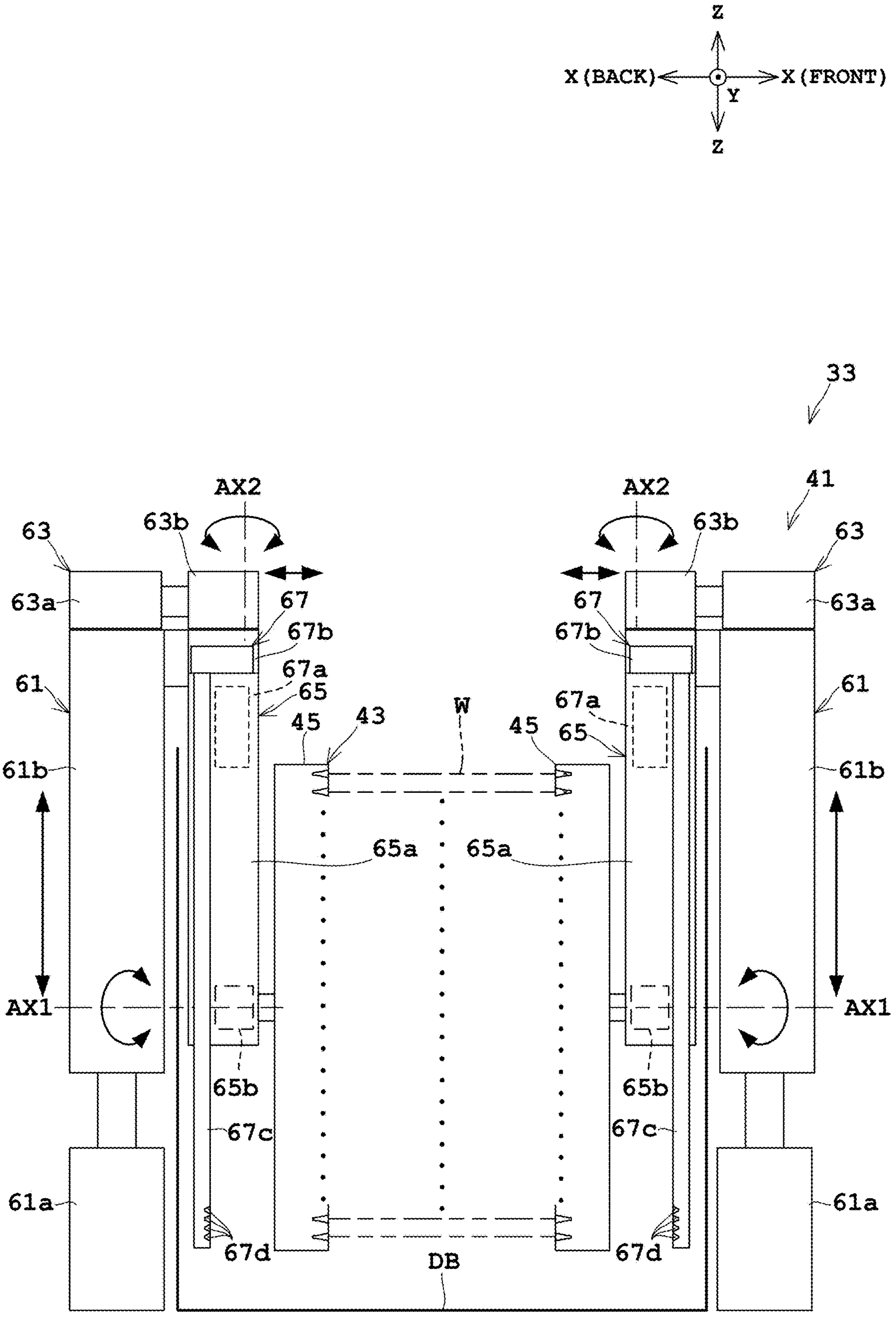
FIG. 9 is a front view illustrating a configuration of a posture turning unit and illustrating a state in which a substrate is held in a horizontal posture.
Figure 10:
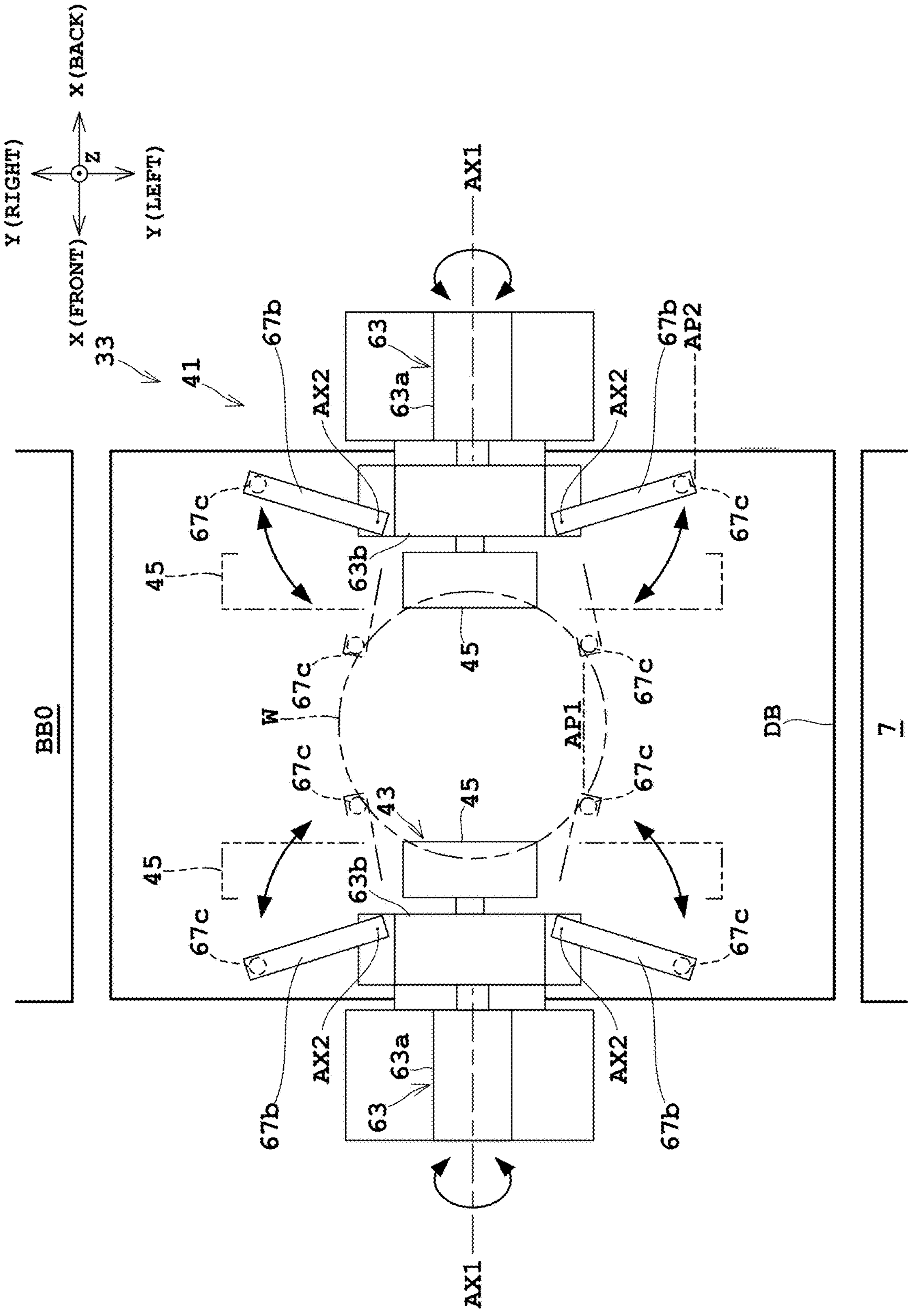
FIG. 10 is a plan view of the posture turning unit.

Here, the posture turning unit 41 will be described with reference to FIGS. 8 to 10. FIG. 8 is a front view illustrating a configuration of the posture turning unit and illustrating a state in which the substrate is held in the vertical posture. FIG. 9 is a front view illustrating a configuration of the posture turning unit and illustrating a state in which the substrate is held in the horizontal posture. FIG. 10 is a plan view of the posture turning unit.

The posture turning unit 41 includes a lifting mechanism 61, a drive mechanism 63, a rotating mechanism 65, and an alignment mechanism 67. The lifting mechanism 61 moves up and down the reversing chuck 43. The drive mechanism 63 opens and closes the reversing chuck 43. The rotating mechanism 65 rotates the reversing chuck 43.

The lifting mechanism 61 is disposed outside the immersion tank DB. The lifting mechanism 61 includes, for example, an actuator 61*a* and a support column 61*b*. The actuator 61*a* drives to move up and down the support column 61*b*. The actuator 61*a* moves up and down the reversing chuck 43 together with the support column 61*b*. The lifting mechanism 61 is moved up and down by the actuator 61*a* over a receiving height HP1, a clamping height HP2, a locking height HP3, and an immersion height HP4 of the reversing chuck 43. The receiving height HP1 is a height for receiving the substrate W in the vertical posture to the reversing chuck 43. The clamping height HP2 is a height for clamping the substrate W in the vertical posture by the reversing chuck 43. The locking height HP3 is a height for locking the substrate W in the vertical posture clamped by the reversing chuck 43. The immersion height HP4 is a height for immersing the substrate W in the vertical posture locked by the reversing chuck 43 in the processing liquid in the immersion tank DB.

The drive mechanism 63 is disposed across the edge of the immersion tank DB. The drive mechanism 63 includes, for example, an actuator 63*a* and a coupling member 63*b*. The actuator 63*a* is disposed on the upper surface of the support column 61*b*. The drive direction of the actuator 63*a* is oriented in the front-back direction X. The actuator 63*a* drives the coupling member 63*b* in the front-back direction X. The coupling member 63*b* is coupled to a rotating mechanism 65 described later. The drive mechanism 63 moves the reversing chuck 43 together with the rotating mechanism 65 in the front-back direction X. The drive mechanism 63 moves the chuck members 45 of the reversing chuck 43 in opposite directions to each other. The drive mechanism 63 adjusts an interval between the chuck members 45 in the front-back direction X to the first interval WD1 and the second interval WD2.

The rotating mechanism 65 is disposed inside the immersion tank DB in plan view. The rotating mechanism 65 includes, for example, a suspension arm 65*a* and a motor 65*b*. The suspension arm 65*a* extends in the front-back direction X from the upper surface of the support column 61*b* and extends downward in the vertical direction Z along the inner wall of the immersion tank DB. The suspension arm 65*a* is moved in the front-back direction X by the drive mechanism 63. The lower portion of the suspension arm 65*a* is immersed in the processing liquid stored in the immersion tank DB. A rotary shaft of the motor 65*b* is coupled to the reversing chuck 43. The motor 65*b* rotates the reversing chuck 43 about an axis AX1. The rotating mechanism 65 can rotate the reversing chuck 43 in either the counterclockwise direction or the clockwise direction about the axis AX1 by the motor 65*b*.

The alignment mechanism 67 includes, for example, four actuators 67*a*, four arms 67*b*, and four alignment bars 67*c*. The actuators 67*a* is built in the suspension arm 65*a*. The rotary shaft of the actuator 67*a* is oriented upward in the vertical direction Z. The arms 67*b* are disposed in a horizontal plane in the front-back direction X and the width direction Y. A base end portion of each of the arms 67*b* is coupled to a rotary shaft of the actuator 67*a*. The upper end portion of the alignment bar 67*c* is coupled to the distal end portion of the arm 67*b*. The base end portion of the arm 67*b* is rotated about the axis AX2 by the actuator 67*a*. As illustrated in FIG. 10, the alignment bars 67*c* are disposed in the 25-piece chuck TFC side and the bridging unit 7 side.

The alignment bar 67*c* extends in the vertical direction Z. As illustrated in FIG. 9, the alignment bar 67*c* has a length enough to fit along all sides of the plurality of substrates W held by the reversing chuck 43 when the reversing chuck 43 is in a long state in the vertical direction Z. It is preferable that the alignment bar 67*c* has grooves 67*d* each formed at a position facing the end surface of each substrate W. Each alignment bar 67*c* is individually operated by each actuator 67*a*. The alignment bar 67*c* is driven across a restricting position AP1 and an allowing position AP2. The restricting position AP1 restricts the plurality of substrates W in the horizontal posture from moving in the horizontal plane including the front-back direction X and the width direction Y. The allowing position AP2 allows the plurality of substrates W in the horizontal posture to move in the horizontal plane including the front-back direction X and the width direction Y.

Here, the description returns to FIGS. 1 and 2.

8. Bridging Unit

The bridging unit 7 couples the batch type processing apparatus 3 and the single wafer type processing apparatus 5. The bridging unit 7 communicates only with the batch type processing apparatus 3 and the single wafer type processing apparatus 5. The bridging unit 7 includes a bridge robot BR. The bridge robot BR is configured to be movable only in the width direction Y. The bridge robot BR does not move up and down in the vertical direction Z. The bridge robot BR includes a hand 71. The hand 71 is configured to be rotatable in a horizontal plane including the front-back direction X and the width direction Y. The hand 71 is configured to be stretchable in the horizontal direction. The bridge robot BR moves the hand 71 forward and backward so as to receive one substrate in a horizontal posture from the posture turning block 15. The bridge robot BR transfers one substrate set in a horizontal posture to the single wafer type processing apparatus 5.

9. Single Wafer Type Processing Apparatus

The single wafer type processing apparatus 5 includes a carry-out block 81, an indexer block 83, and a processing block 85.

10. Carry-Out Block

The carry-out block 81 includes a carry-out unit 87. The carry-out unit 87 is disposed at the front side X of the single wafer type processing apparatus 5. The carrier C is placed on the carry-out unit 87. The carry-out block 81 includes, for example, four carry-out units 87. The four carry-out units 87 are disposed along the width direction Y. The carry-out unit 87 is also called a load port.

11. Indexer Block

The indexer block 83 includes an indexer robot IR. The indexer robot IR includes, for example, an articulated arm 89 and a hand 91. The indexer robot IR does not move in the width direction Y and the front-back direction X. The indexer robot IR bends the articulated arm 89 and moves the hand 91. The indexer robot IR moves up and down the hand 91 in the vertical direction Z. The indexer robot IR can access each cassette C placed on the four carry-out units 87. The indexer robot IR transports one substrate W with the hand 91. The indexer robot IR transports one substrate W from the processing block 85 to the carry-out unit 87.

12. Processing Block

The processing block 85 includes four towers TW1 to TW4 and a center robot CR.

The tower TW1 is disposed at the front side X of the indexer block 83. The tower TW1 is disposed adjacent to the indexer block 83. The tower TW1 includes processing chamber-MPCs stacked in the vertical direction Z. The tower TW1 includes, for example, three processing chamber MPCs. Each of the processing chamber-MPCs processes the substrates W one by one. Each of the processing chamber-PMCs performs, for example, drying processing on the substrate W.

The tower TW2 is disposed at the back side X of the tower TW1. The tower TW2 is disposed adjacent to the tower TW1. The tower TW2 has the same configuration as the tower TW1. That is, the tower TW2 includes three processing chamber-MPCs stacked in the vertical direction Z.

The tower TW3 is disposed at the left side Y of the tower TW2. The tower TW3 is disposed at the left side Y of the tower TW2 with the center robot CR interposed therebetween. The tower TW3 also has the same configuration as the towers TW1 and TW2. That is, the tower TW3 includes three processing chambers MPCs stacked in the vertical direction Z.

The tower TW4 is partially different in configuration from the towers TW1 to TW4. That is, the tower TW4 includes the processing chamber-MPCs at the bottom and the top in the vertical direction Z. The tower TW4 includes a transfer unit 93 at the central portion in the vertical direction Z. One substrate W is placed on the transfer unit 93. The transfer unit 93 includes a lifting pin 93*a*. The lifting pin 93*a* is moved up and down when the substrate W is received from the bridge robot BR. One substrate W is placed on the transfer unit 93 from the bridge robot BR. In the transfer unit 93, one placed substrate W is received by the center robot CR.

The center robot CR is configured to be movable in the front-back direction X. The center robot CR includes a hand 95. The hand 95 moves up and down in the vertical direction Z. The hand 95 is configured to be rotatable in a plane including the front-back direction X and the width direction Y. The hand 95 is moved so as to be able to access the processing chamber-MPC and the transfer unit 93 of the towers TW1 to TW4. That is, the center robot CR can freely move the hand 95 in the vertical direction Z, the front-back direction X, and the width direction Y. The center robot CR transfers the processed substrate W to the indexer robot 83.

13. Description of Operation

An example of processing by the substrate processing apparatus 1 will be described with reference to FIGS. 1 and 2.

First, an overall outlined processing flow will be described.

14. Batch Processing

The carrier C accommodating a plurality of unprocessed substrates W is placed on the charging unit 19. The carrier C is carried into the stocker block 11 by the transport mechanism 23. Two sets of the plurality of substrates W are assembled as a batch lot by the first transport mechanism HTR and the transfer mechanism CTC. The plurality of substrates W constituting the batch lot are transported to the processing block 17 by the second transport mechanism WTR. In the processing block 17, for example, the etching processing with phosphoric acid is performed in the second batch processing unit BPU2. Thereafter, the plurality of substrates W constituting the batch lot are subjected to pure water cleaning processing by the first batch processing unit BPU1. Next, the plurality of substrates W constituting the batch lot are transported to the posture turning block 15 by the second transport mechanism WTR. In the posture turning block 15, only one of the batch lots is transported to the posture turning tank 33. In the posture turning tank 33, only one of the batch lots turns the posture of the plurality of substrates W in the vertical posture to the horizontal posture in the liquid. Thereafter, the plurality of substrates W constituting one lot of the batch lot are sequentially transported one by one to the single wafer type processing apparatus 5. Thereafter, the posture of another one of the batch lots is similarly turned, and then transported to the single wafer type processing apparatus 5.

15. Single Wafer Processing

The one substrate W turned to the horizontal posture is transported to the single wafer type processing apparatus 5 by the bridge robot BR. Specifically, one substrate W is placed on the transfer unit 93. One substrate W placed on the transfer unit 93 is received by the center robot CR. The center robot CR carries one substrate W into, for example, the processing chamber-MPC of the tower TW1. In the processing chamber-MPC, for example, the substrate W is subjected to a drying processing. Specifically, for example, pure water is supplied while rotating the substrate W. Thereafter, IPA is supplied to the substrate W to replace pure water of the substrate W with IPA. Thereafter, the substrate W is rotated at a high speed and dried. In addition, it is preferable to perform a drying processing with carbon dioxide of the supercritical fluid in another processing chamber MPC as necessary. The finish drying processing is performed on the substrate W by the drying processing with the supercritical fluid. As a result, the substrate W is completely dried, but collapse of the pattern formed on the substrate W is suppressed.

One substrate W subjected to the drying processing is carried out to the carry-out unit 87 via the center robot CR and the indexer robot IR. The indexer robot IR accommodates one substrate W in the carrier C placed on the carry-out unit 87. The substrates W constituting the same lot to be processed subsequently are housed in the same carrier C.

16. Posture Turn Processing

Although the above is an outlined processing flow by the substrate processing apparatus 1, details of the posture turning will be described below. Here, refer to FIGS. 11 to 28. FIGS. 11 to 20 and FIGS. 22 to 28 are views each explaining an operation of turning a posture of the substrate. FIG. 21 is a longitudinal sectional view showing the operation of the reversing chuck.

Figure 11:
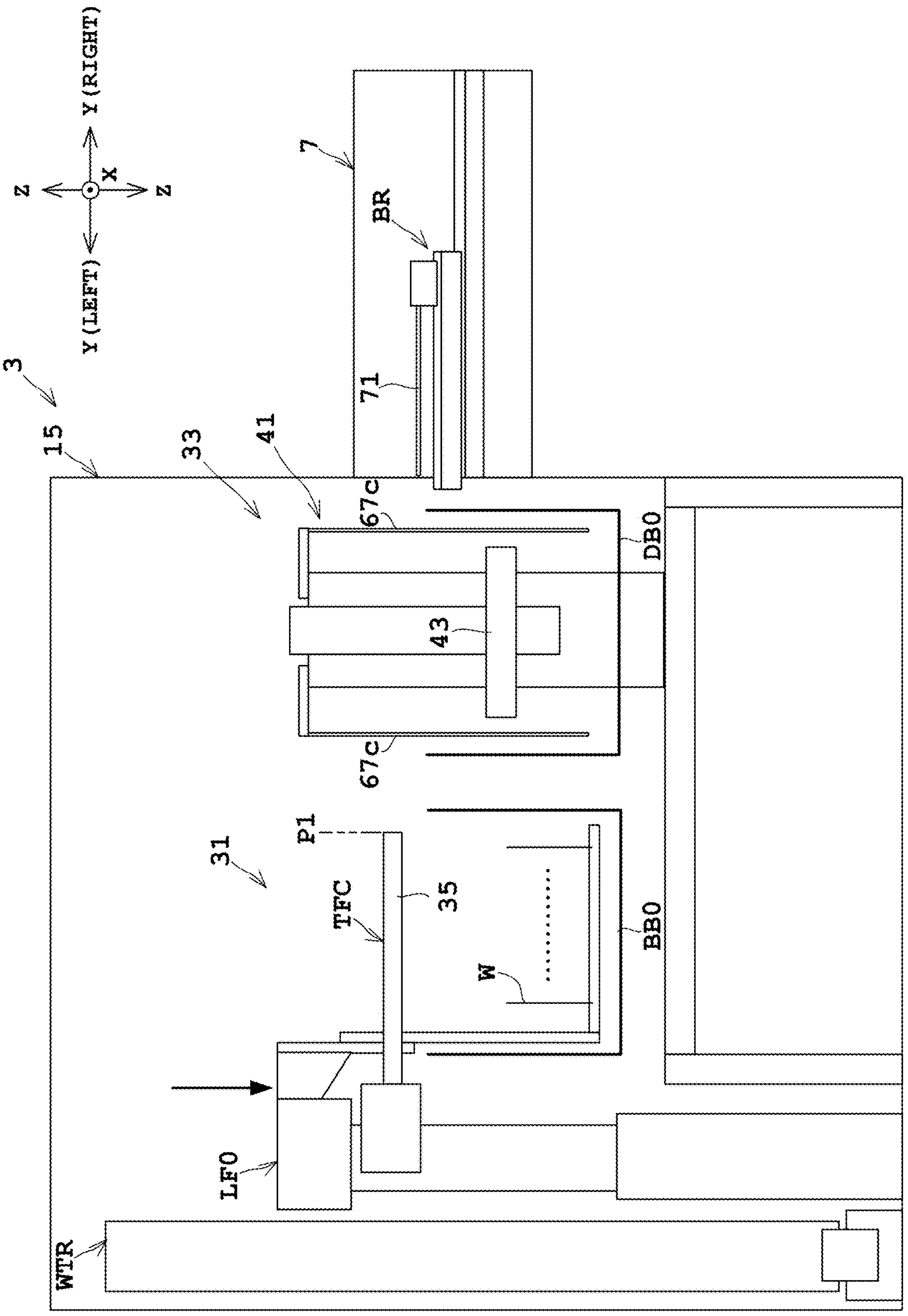
FIG. 11 is a view for explaining an operation of turning a posture of the substrate.

Refer to FIG. 11.

The plurality of substrates W constituting the batch lot subjected to the batch processing are transferred to the lifter LF0 of the standby tank 31 by the second transport mechanism WTR. The lifter LF0 moves the plurality of substrates W constituting the batch lot to the standby position inside the standby tank 31. Since the plurality of substrates W constituting the batch lot stand by in this state, drying can be prevented. That is, collapse of a pattern or the like formed on the substrate W after batch processing can be prevented. The alignment bars 67*c* are each located at an allowing position.

Figure 12:
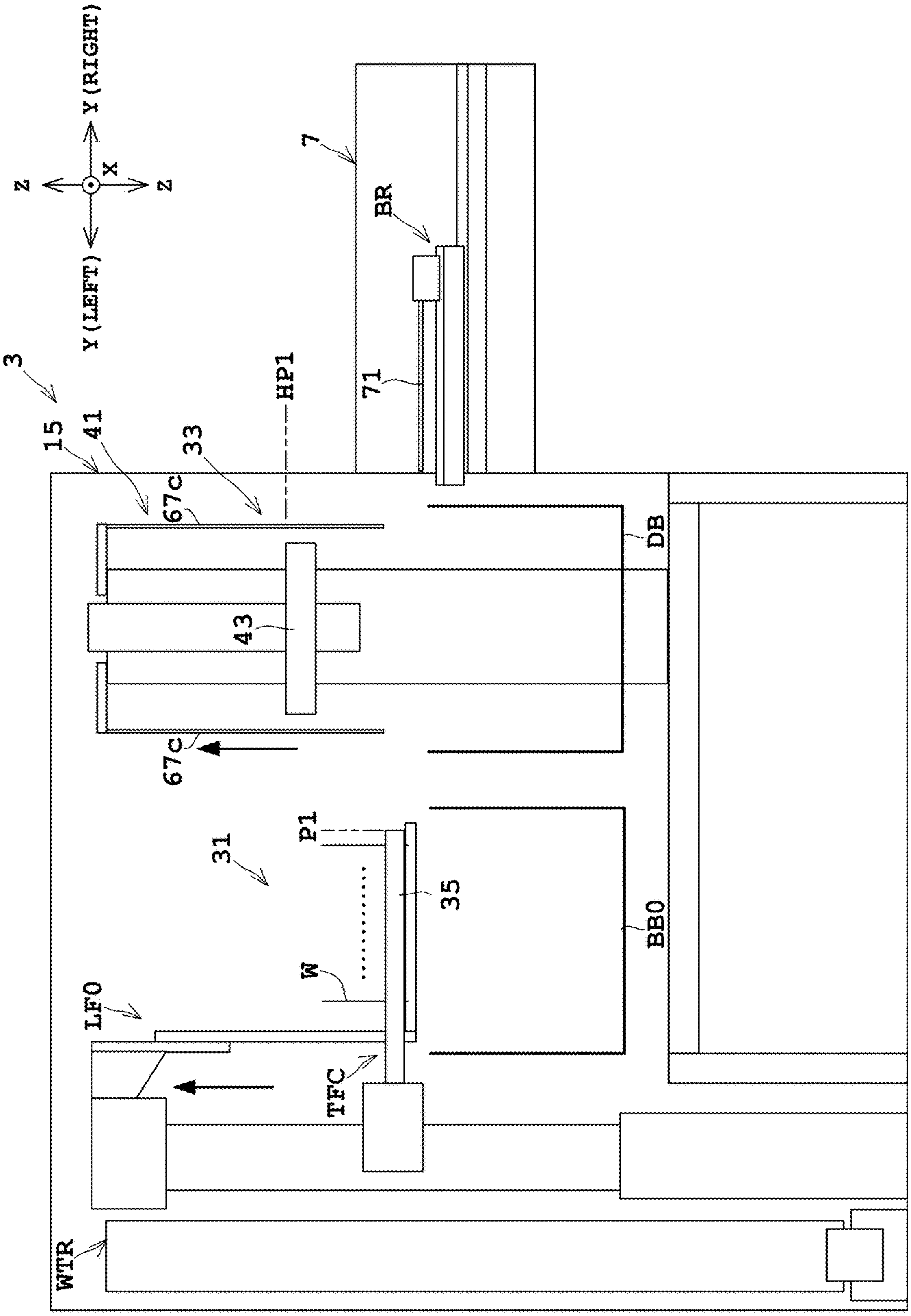
FIG. 12 is a view for explaining the operation of turning the posture of the substrate.

Refer to FIG. 12.

The 25-piece chuck TFC is located at the first transfer position P1. The 25-piece chuck TFC opens the hand 35. That is, in the 25-piece chuck TFC, the hand 35 is at the passing position PT (refer to FIG. 3). The lifter LF0 is moved up to the transfer position above the liquid level of the standby tank BB0. At this time, since the hand 35 is at the passing position PT in the 25-piece chuck TFC, the plurality of substrates W can pass between the 25-piece chucks TFC and move up. At the same time, the reversing chuck 43 is moved up to the receiving height HP1 by the posture turning unit 41 in the posture turning tank 33.

Figure 13:
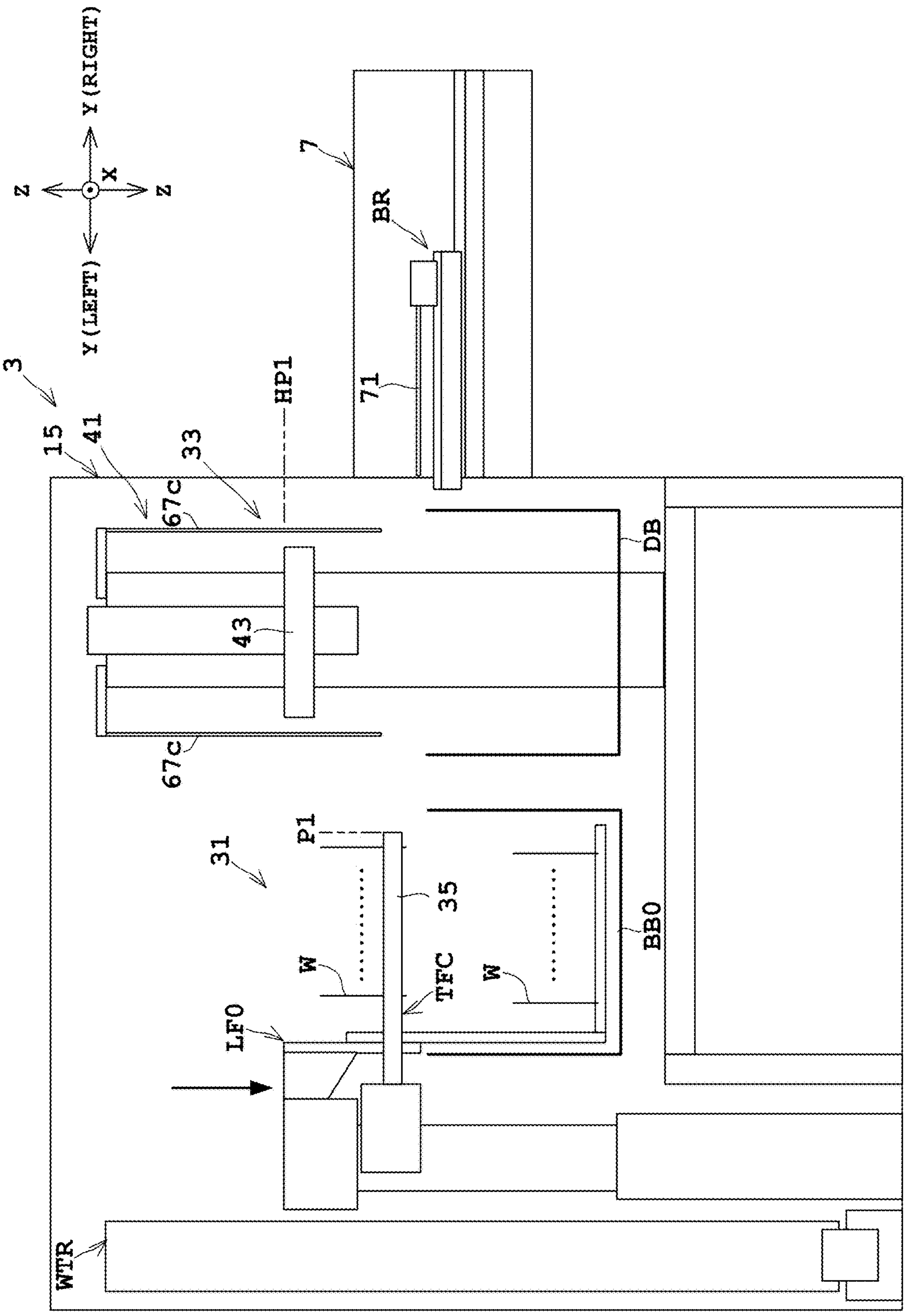
FIG. 13 is a view for explaining the operation of turning the posture of the substrate.

Refer to FIG. 13.

The 25-piece chuck TFC closes the hand 35. That is, in the 25-piece chuck TFC, the hand 35 is at the holding position PC (refer to FIG. 3). In this state, the lifter LF0 is moved down to the standby position. As a result, among the plurality of substrates W of the batch lot placed on the lifter LF0, only the plurality of odd numbered substrates W constituting one lot are placed on the 25-piece chucks TFC. Among the plurality of substrates W of the batch lot placed on the lifter LF0, the plurality of even-numbered substrates W constituting another lot descend into the standby tank BB0 together with the lifter LF0. As a result, the hand 35 of the 25-piece chuck TFC is set to the second transfer position PT2, which allows the even-numbered substrates W to standby in a state being prevented from drying until they are moved to the posture turning tank 33. Therefore, pattern collapse due to drying of the plurality of substrates W constituting another lot can also be prevented.

Figure 14:
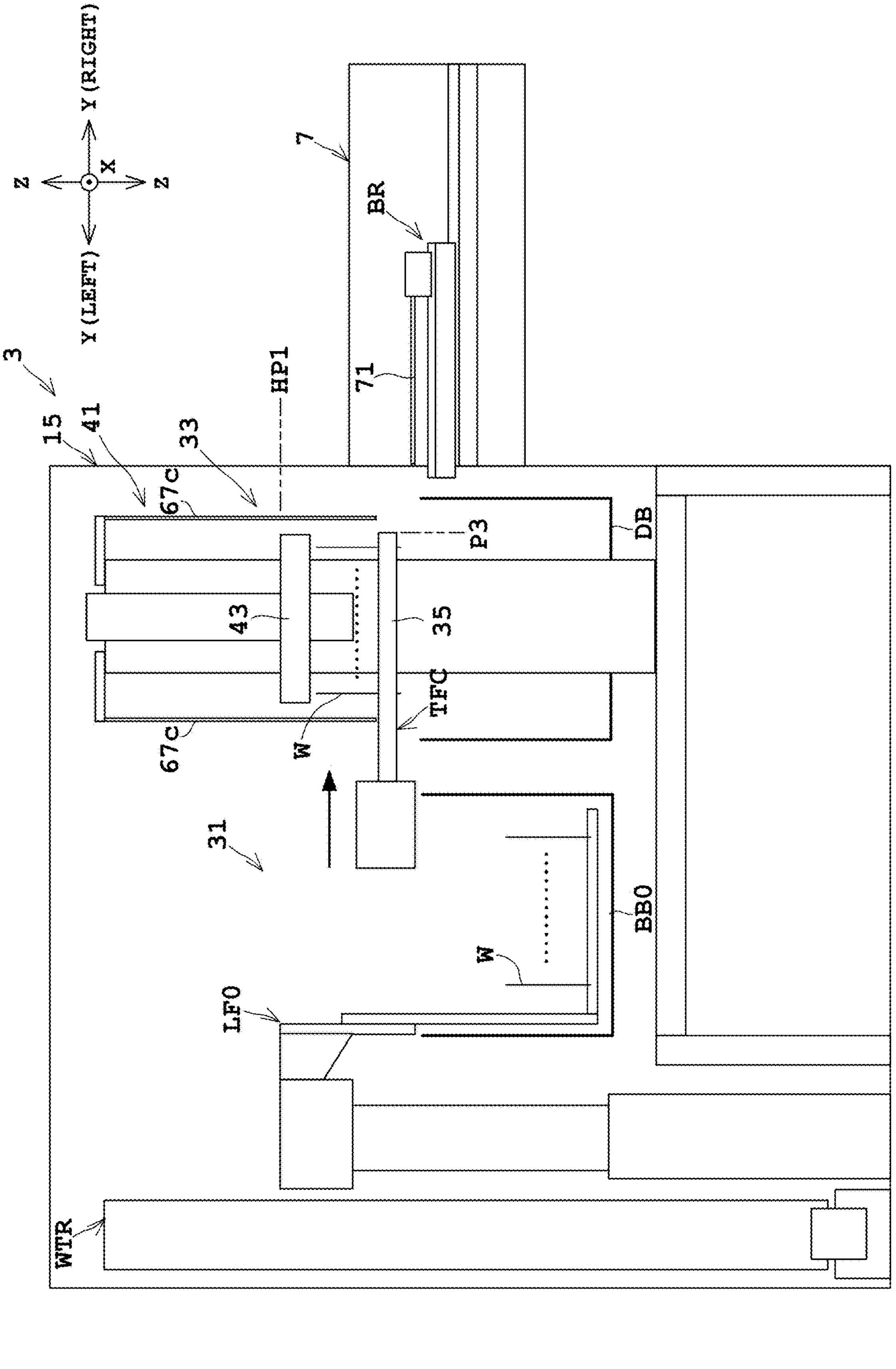
FIG. 14 is a view for explaining the operation of turning the posture of the substrate.

Refer to FIG. 14.

The 25-piece chuck TFC advances the hand 35 toward the right side Y up to the third transfer position P3. At this time, since the reversing chuck 43 is positioned at the receiving height HP1, interference with the substrate W does not occur.

Figure 15:
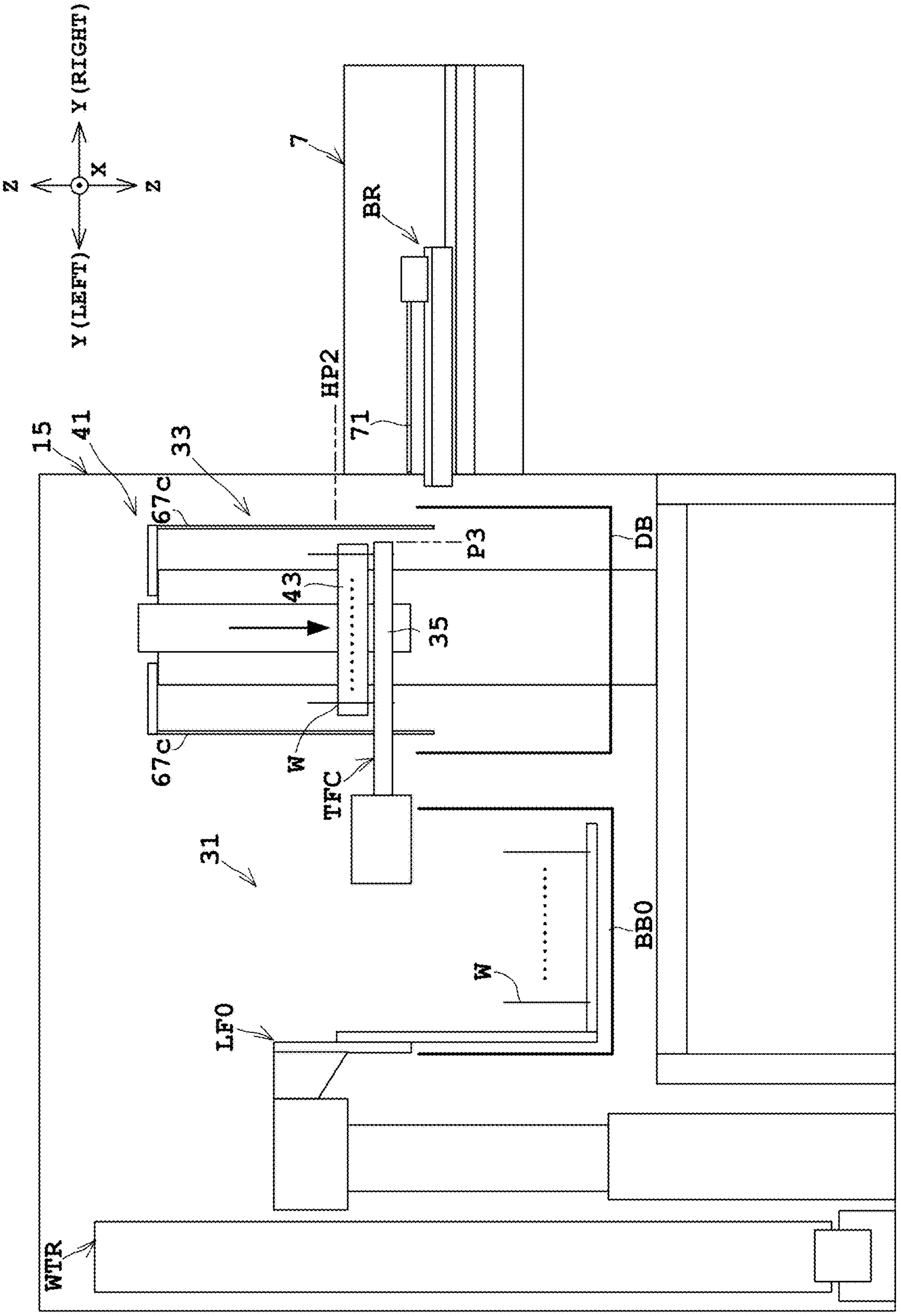
FIG. 15 is a view for explaining the operation of turning the posture of the substrate.

Refer to FIG. 15.

The reversing chuck 43 is set to the first interval WD1 (refer to FIG. 4). In this state, the reversing chuck 43 is moved down to the plurality of substrates W placed on the 25-piece chuck TFC. Specifically, the reversing chuck 43 is moved down to the clamping height HP2. The states of the reversing chuck 43 and the substrates W at this time are as shown in FIGS. 4 and 6. That is, the edges of the substrates W are merely positioned in the vicinity of the first groove SL1 of the reversing chuck 43 and are not in contact with the reversing chuck 43. In other words, the plurality of substrates W are accommodated in a non-contact state with the reversing chuck 43.

Figure 16:
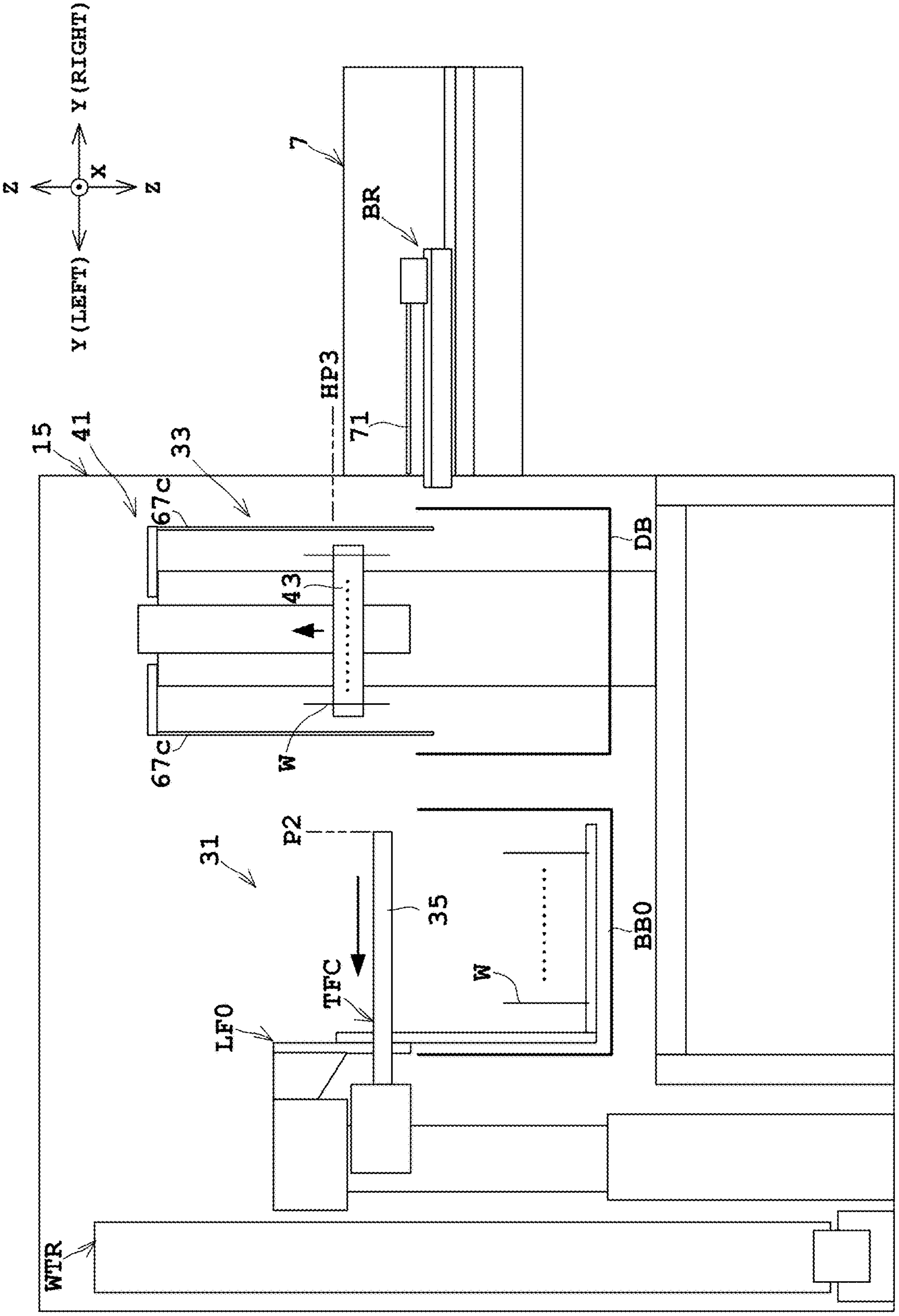
FIG. 16 is a view for explaining the operation of turning the posture of the substrate.

Refer to FIG. 16.

The reversing chuck 43 has the second interval WD2 (refer to FIG. 5). As a result, the substrates W accommodated in the reversing chuck 43 in a non-contact manner are clamped. As a result, as illustrated in FIG. 7, the end surfaces of the substrates W are clamped between the second groove SL2 of the reversing chuck 43. In other words, the end surfaces of the substrates W are abutted and supported by the top portion 49 of the second groove SL21. Further, the reversing chuck 43 is moved up to the locking height HP3. As a result, among lower edge portions of the end surfaces of the substrates W clamped by the reversing chuck 43, the lower edge portions being located below the side, abuts on and are locked to the second groove SL2. Although not illustrated, the 25-piece chuck TFC is moved to the second transfer position P2 in a state where the reversing chuck 43 is temporarily moved up to the receiving height HP1. As a result, the 25-piece chuck TFC is ready to receive the plurality of substrates W constituting another lot placed on the lifter LF0.

Figure 17:
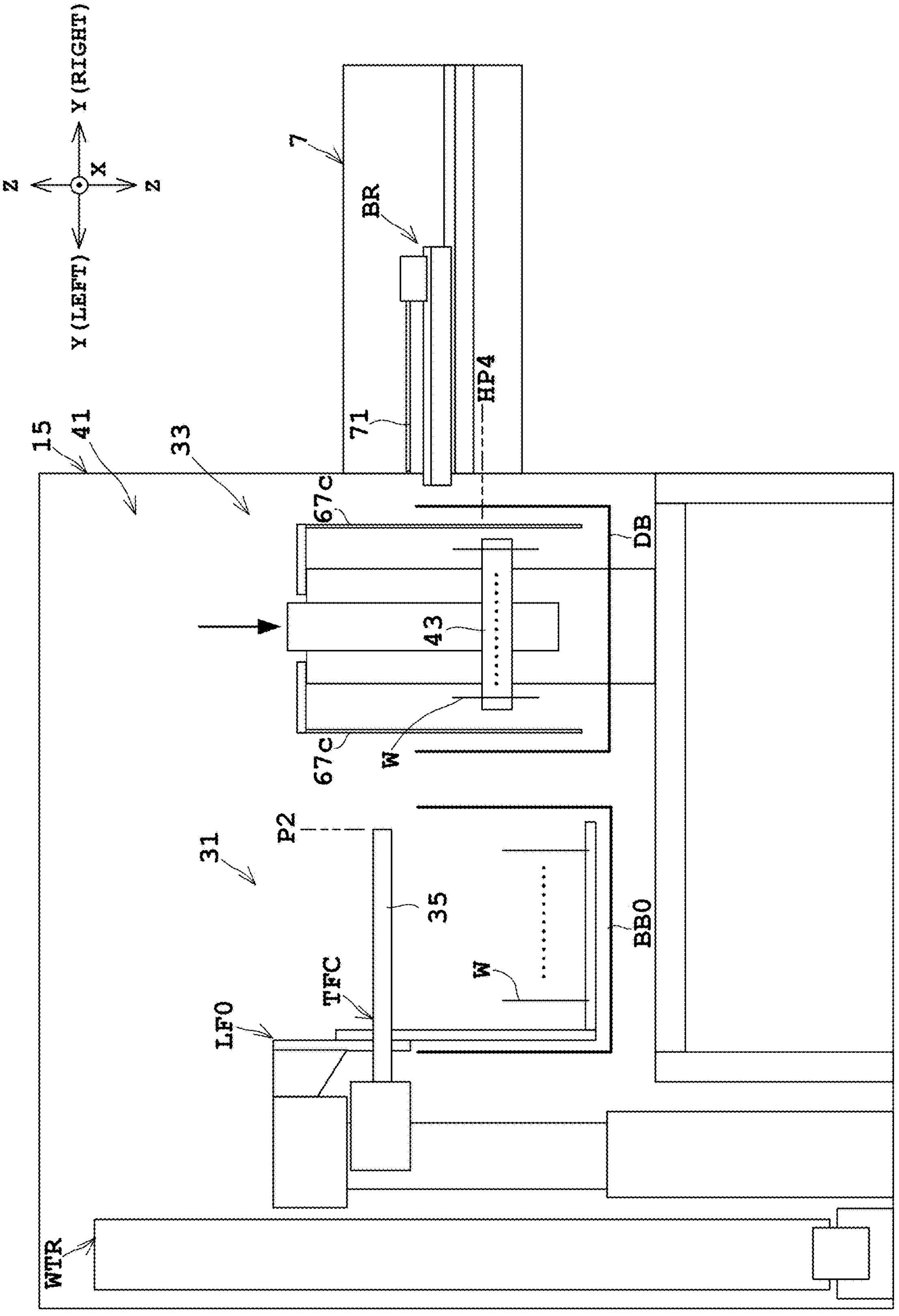
FIG. 17 is a view for explaining the operation of turning the posture of the substrate.

Refer to FIG. 17.

The reversing chuck 43 is moved down to the immersion height HP4. As a result, the plurality of substrates W clamped by the reversing chuck 43 are immersed in the processing liquid in the immersion tank DB. The entirety of the plurality of substrates W is immersed under the processing liquid in the immersion tank DB. In the posture turning block 15, the plurality of substrates W constituting one lot are in a state of being exposed from the liquid for a short time until being raised from the standby tank BB0 and immersed in the immersion tank DB.

Figure 18:
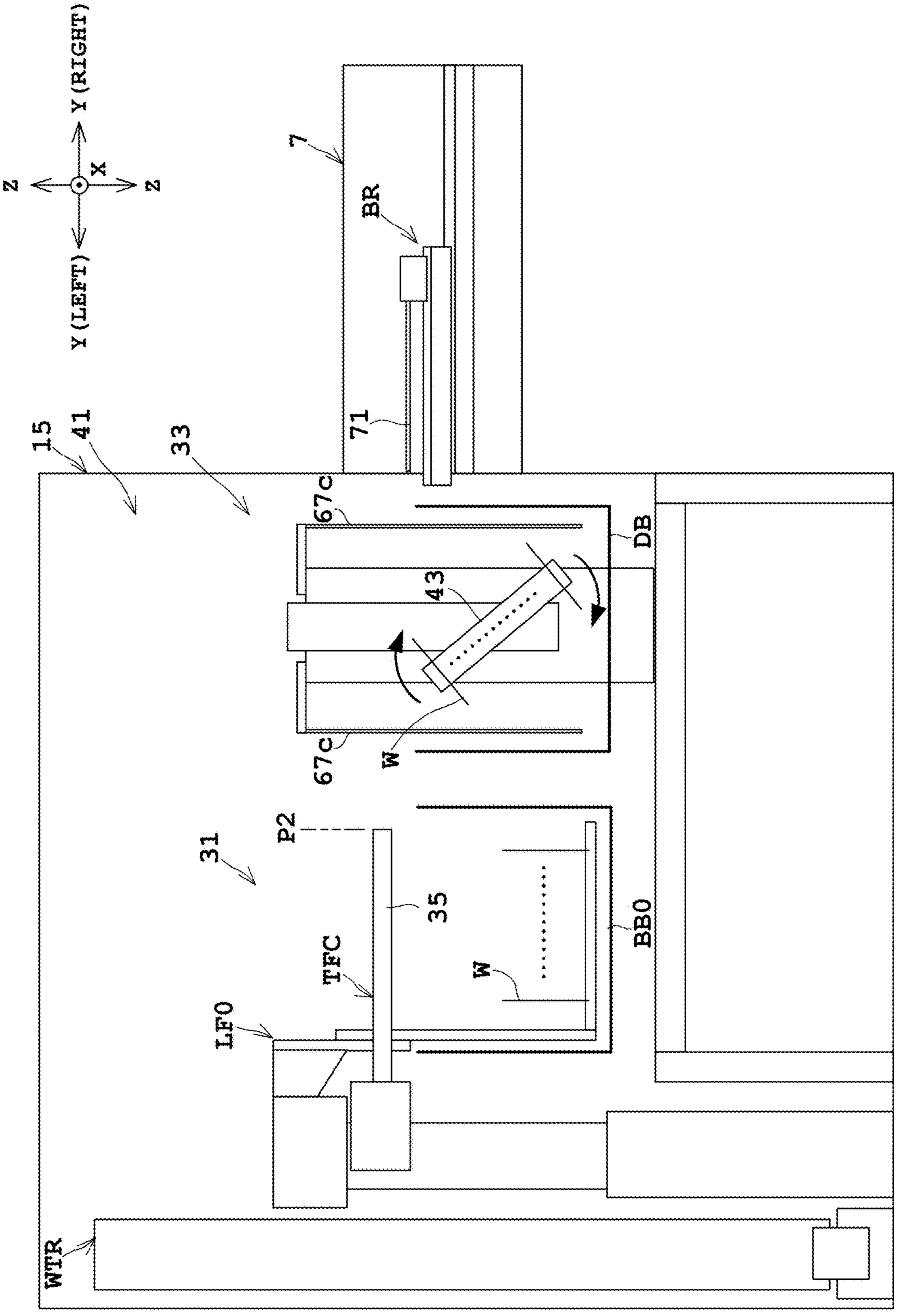
FIG. 18 is a view for explaining the operation of turning the posture of the substrate.
Figure 19:
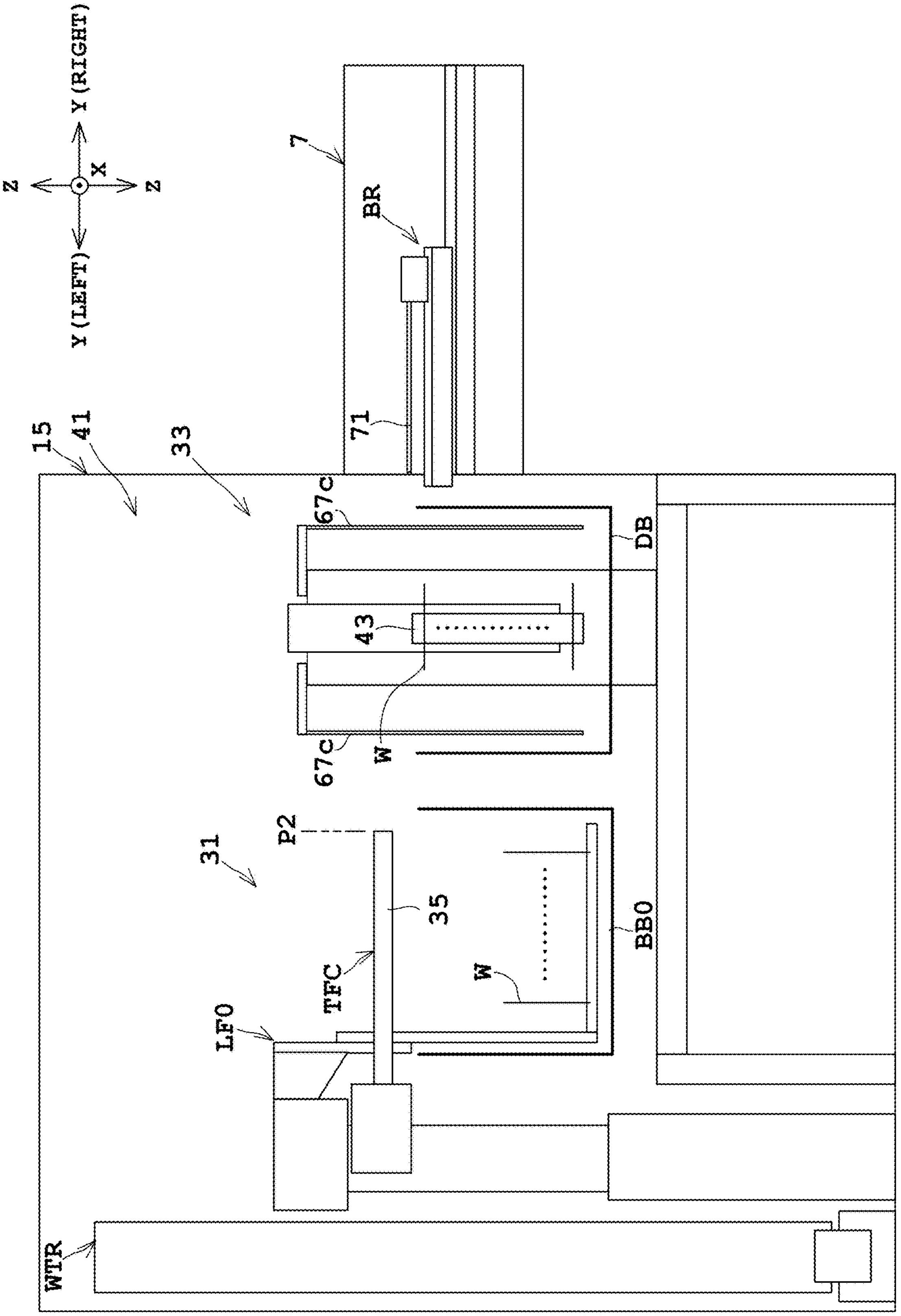
FIG. 19 is a view for explaining the operation of turning the posture of the substrate.

Refer to FIGS. 18 and 19.

The reversing chuck 43 is rotated by 90°. Specifically, in this example, it is rotated clockwise by 90°. The rotation direction may be determined by in which direction the processing surface (front face) of the substrate W is located. That is, the rotation direction may be determined such that the processing surface of the substrate W faces upward. As a result, the plurality of substrates W are turned to the horizontal posture.

Figure 20:
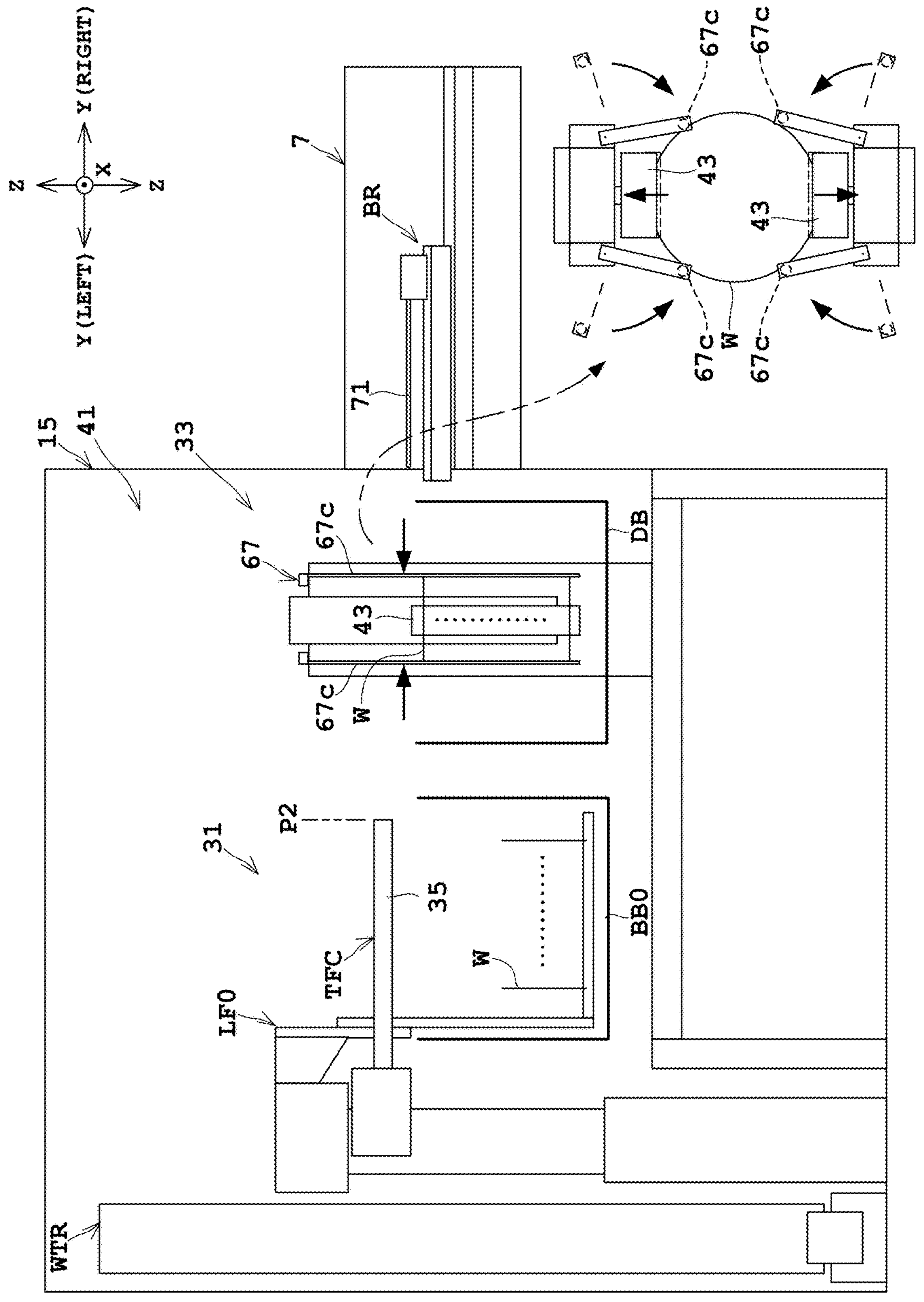
FIG. 20 is a view for explaining the operation of turning the posture of the substrate.
Figure 21:
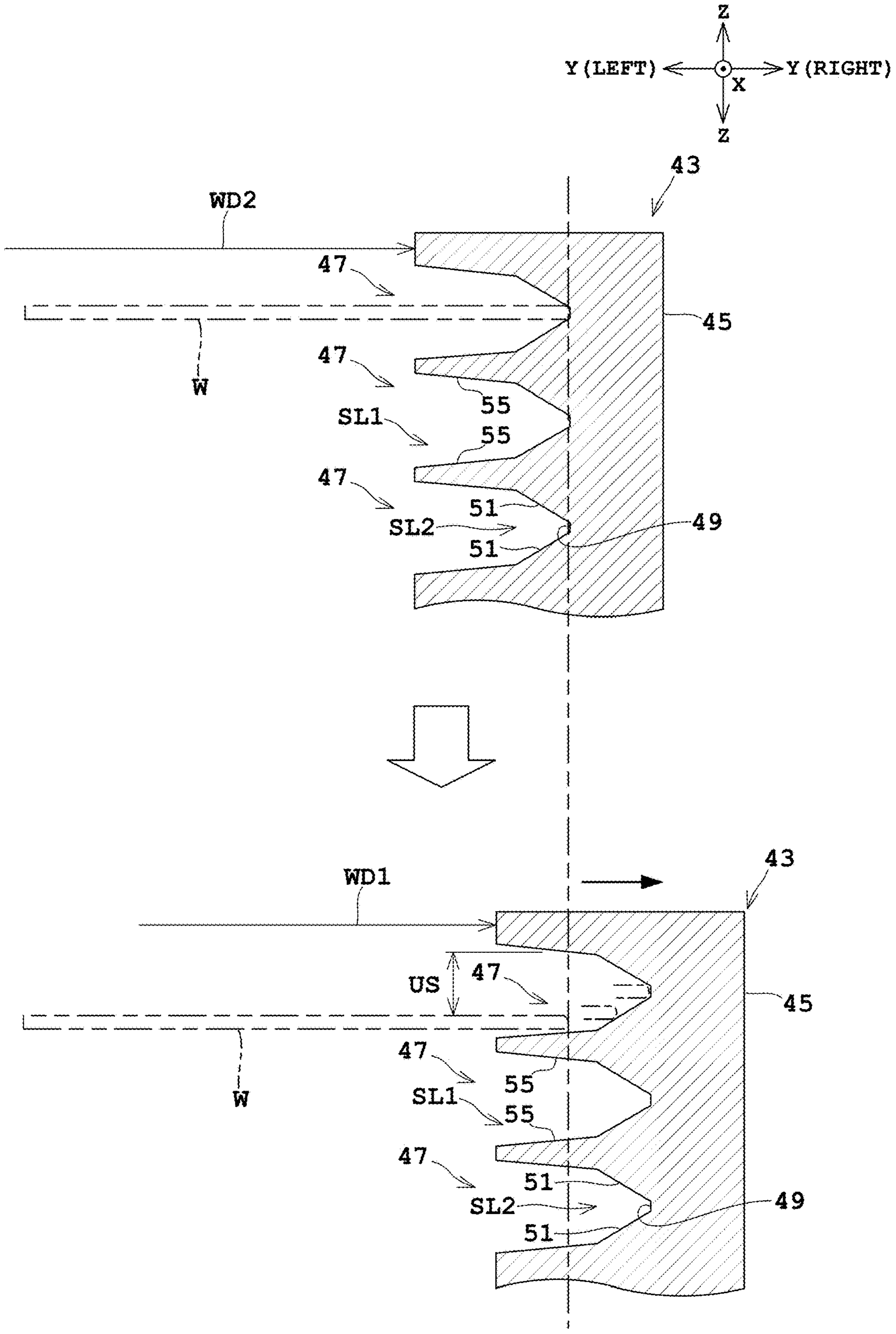
FIG. 21 is a longitudinal sectional view showing the operation of the reversing chuck.

Refer to FIG. 20.

The alignment mechanism 67 moves the alignment bars 67*c* to the restricting position. As a result, as illustrated in a partially enlarged view indicated by a two-dot chain line arrow in FIG. 20, the outer peripheral edges of the plurality of substrates W are positionally restricted by the alignment bars 67*c*. Specifically, movement in a horizontal plane including the front-back direction X and the width direction Y is restricted.

Refer to FIG. 21.

The reversing chuck 43 is expanded to the first interval WD1. As a result, the position of the end surface of the substrate W moves from the second groove SL2 to the first groove SL1. Therefore, an interval US between the upper surface, which is the processing surface (front face) of the substrate W, and the upper surface of the groove portion 47 is increased. At this time, the lower surface of the substrate W moves from the depth-side inclined surface 51 of the second groove SL2 to the front-side inclined surface 55 of the first groove SL1 while sliding. The front-side inclined surface 55 of the first groove SL1 is inclined more gently than the depth-side inclined surface 51 of the second groove SL2. Therefore, the impact applied to the lower surface of the substrate W can be reduced. Therefore, it is possible to suppress generation of particles when the reversing chuck 43 is set to the first interval WD1. In addition, the substrate W is pulled in the moving direction of the reversing chuck 43 by friction. At this time, since the alignment bar 67*c* is at the restricting position, it is possible to prevent the horizontal position of the substrate W from being displaced. Therefore, it is possible to prevent a transport error by the bridge robot BR to be described later, and it is possible to reliably transfer the substrate W.

The alignment bar 67*c* has a groove 67*d* formed at a position corresponding to the end surface of the substrate W. Therefore, when the substrate W moves downward, the end surface of the substrate W can be prevented from being dragged by the alignment bar 67*c* to generate particles.

Figure 22:
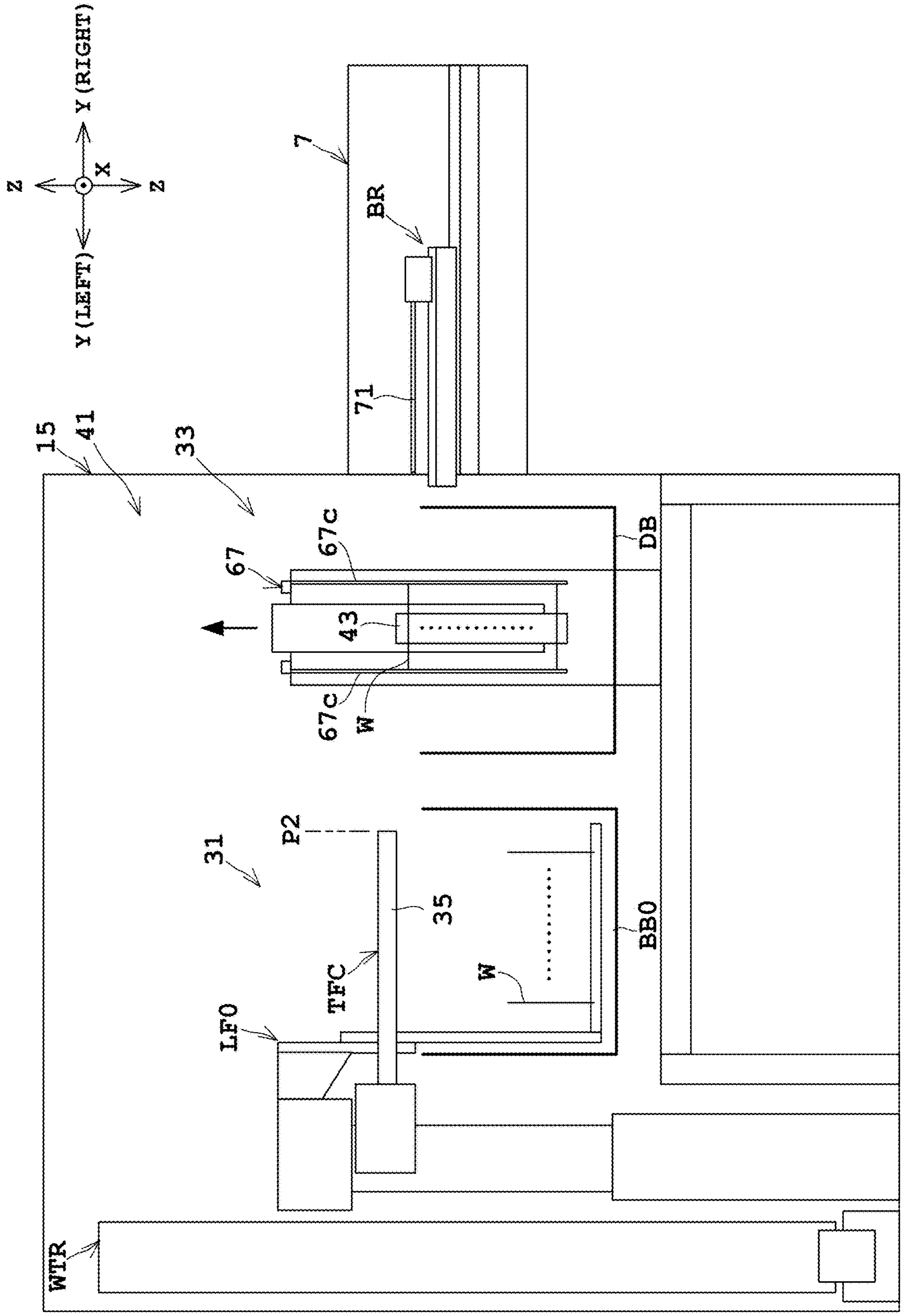
FIG. 22 is a view for explaining the operation of turning the posture of the substrate.

Refer to FIG. 22.

The reversing chuck 43 is moved upward. Specifically, the reversing chuck 43 is moved upward such that only the substrate W clamped by the uppermost groove portion 47 of the reversing chuck 43 is exposed from the liquid in the immersion tank DB. The height of the reversing chuck 43 is as high as the hand 71 of the bridge robot BR can enter a position slightly separated downward from the lower surface of the substrate W exposed from the liquid.

Figure 23:
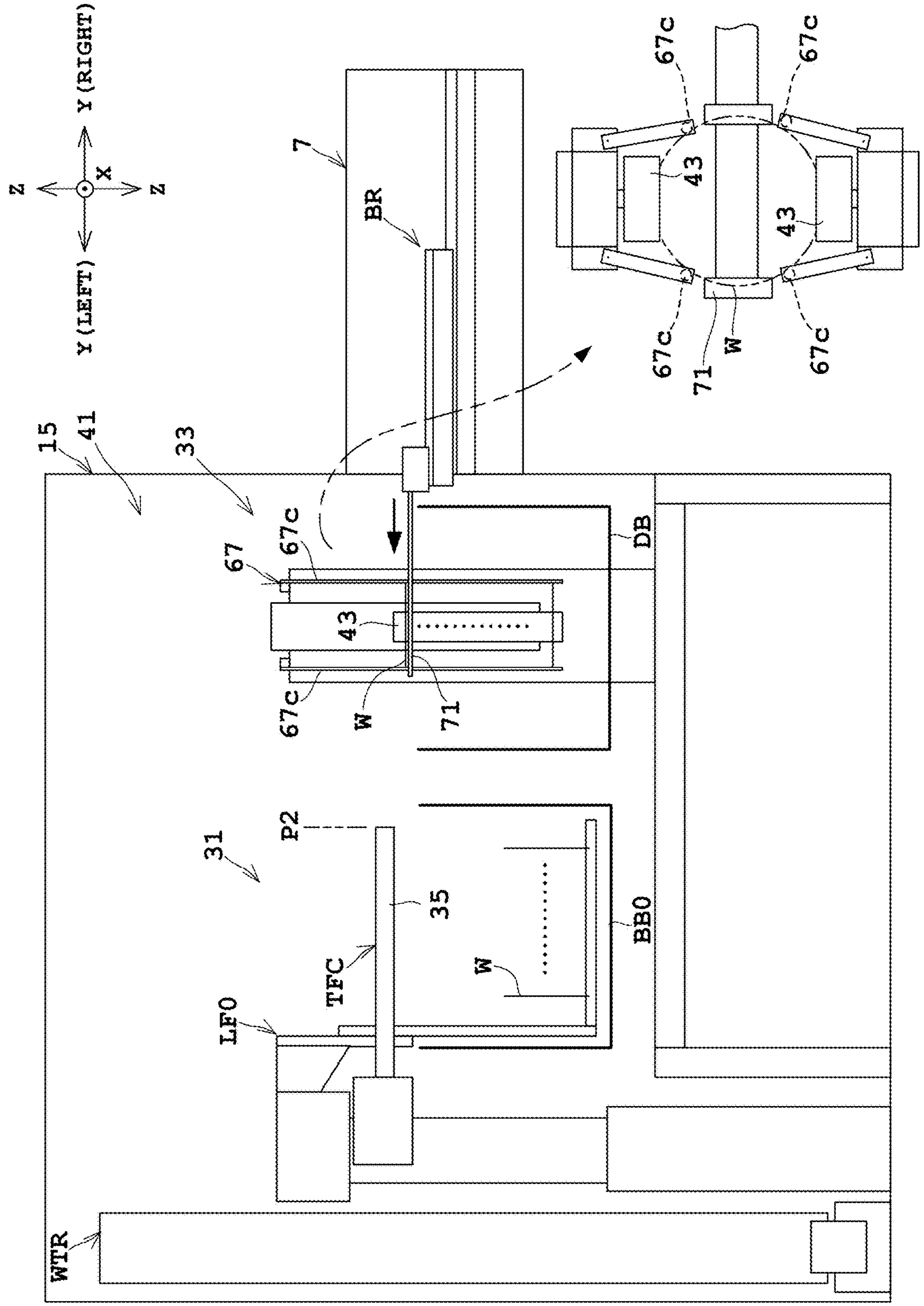
FIG. 23 is a view for explaining the operation of turning the posture of the substrate.

Refer to FIG. 23.

The hand 71 of the bridge robot BR enters the posture turning unit 41. The hand 71 enters a position slightly separated downward from the lower surface of the substrate W.

Figure 24:
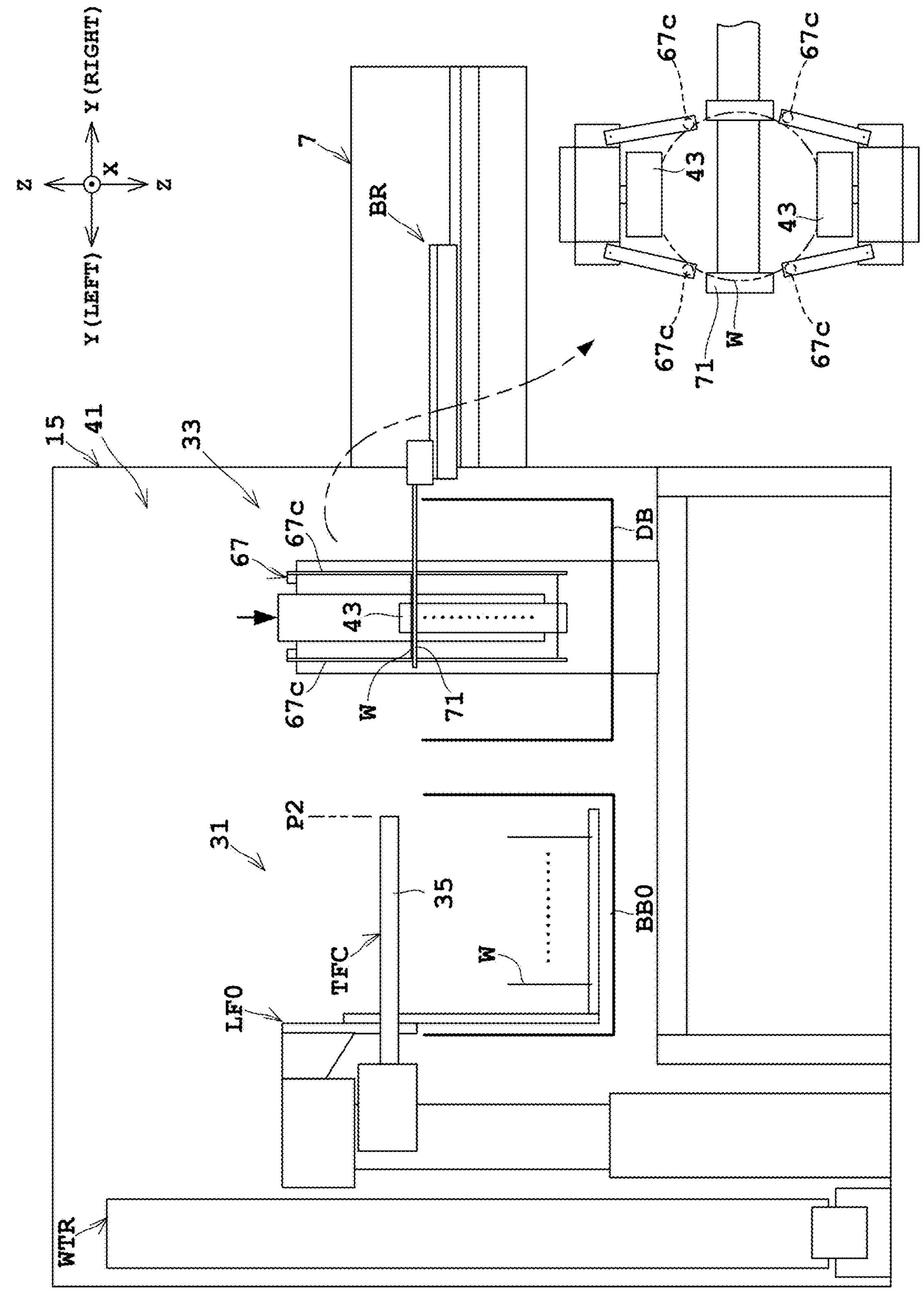
FIG. 24 is a view for explaining the operation of turning the posture of the substrate.

Refer to FIG. 24.

The reversing chuck 43 is moved downward. The moving distance is less than the total value of the interval US and the interval between the hand 71 that has entered and the lower surface of the substrate W. The substrate W is transferred to the hand 71 by the movement of the reversing chuck 43.

Figure 25:
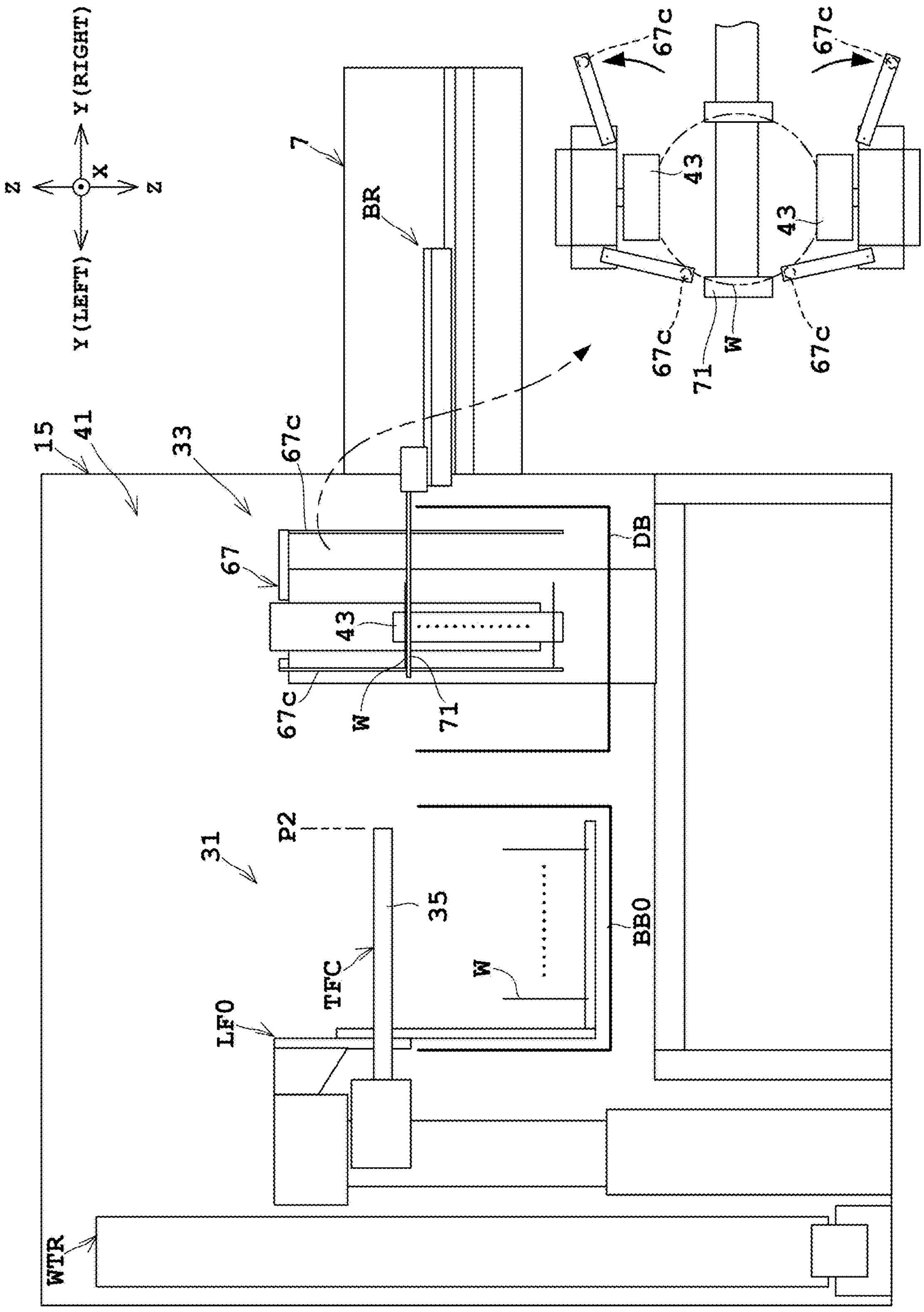
FIG. 25 is a view for explaining the operation of turning the posture of the substrate.

Refer to FIG. 25.

The alignment bar 67*c* positioned on the right side Y is moved to the allowing position AP2 until the bridge robot BR moves the hand 71 to the right side Y.

Figure 26:
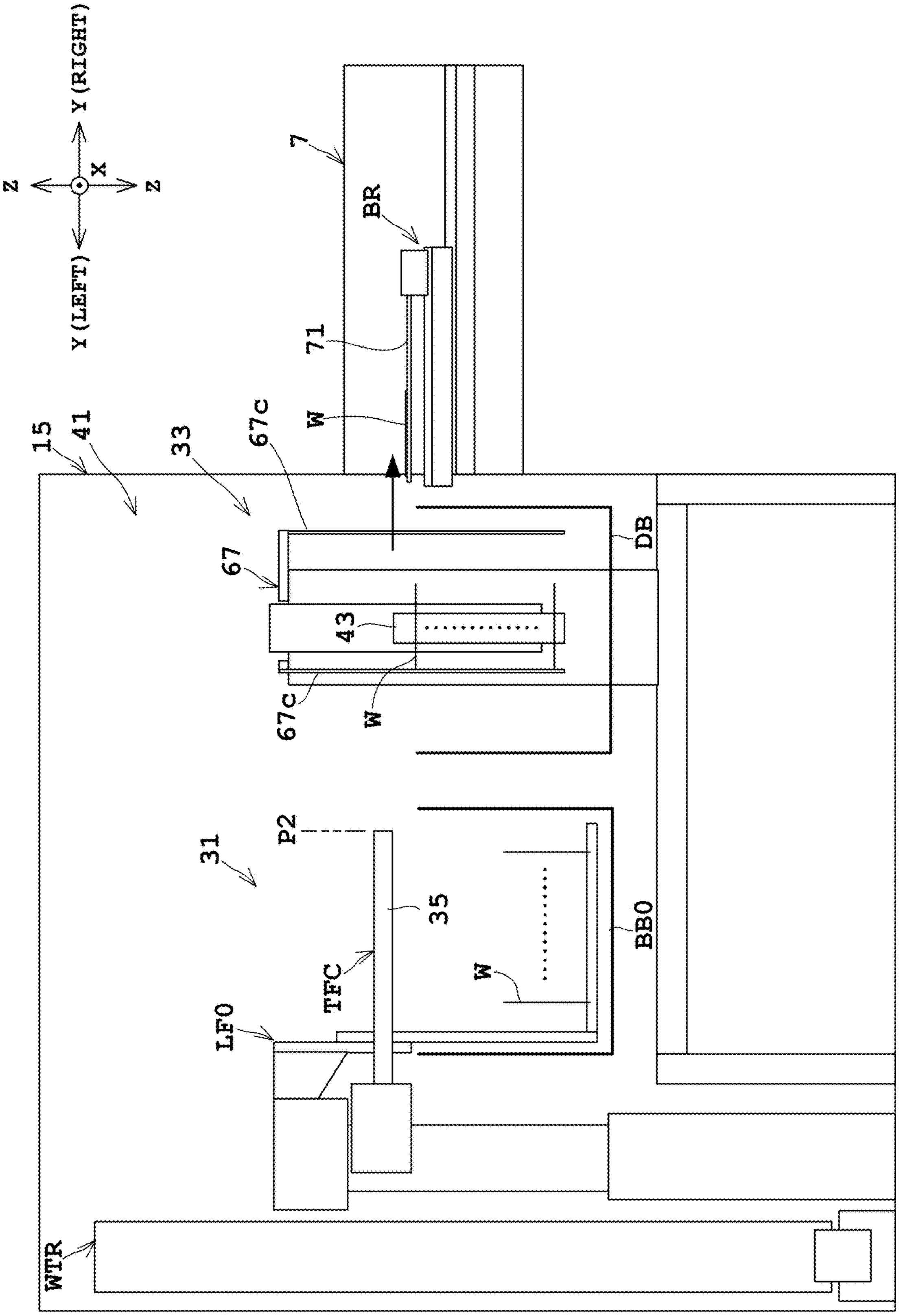
FIG. 26 is a view for explaining the operation of turning the posture of the substrate.

Refer to FIG. 26.

The bridge robot BR moves the hand 71 to the right side Y to remove the uppermost substrate W from the reversing chuck 43. Since the alignment bar 67*c* positioned on the right side Y is moved to the allowing position AP2, the substrate W can be smoothly transferred.

Figure 27:
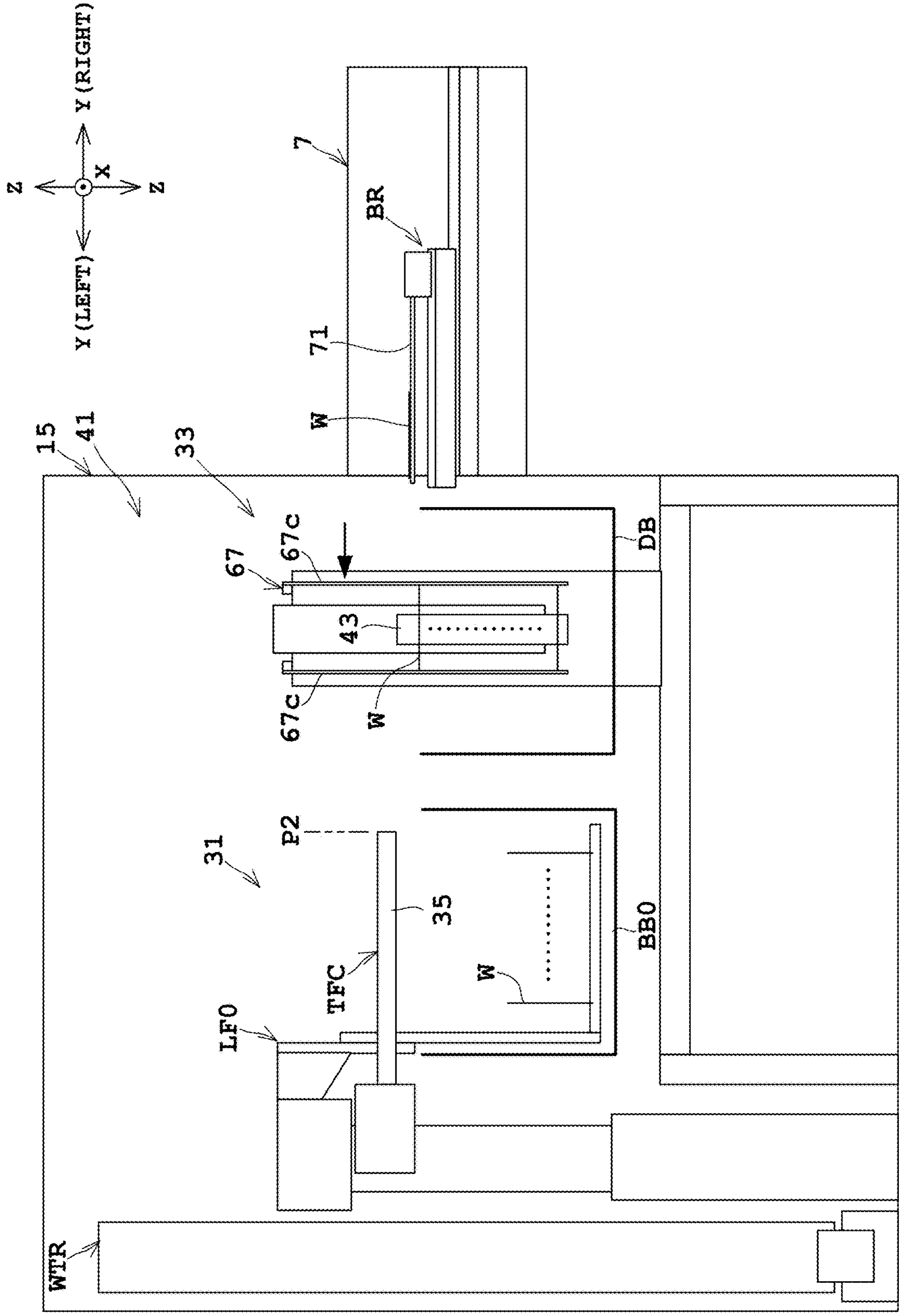
FIG. 27 is a view for explaining the operation of turning the posture of the substrate.

Refer to FIG. 27.

After the uppermost substrate W is pulled out from the reversing chuck 43, the two alignment bars 67*c* on the right side Y are moved to the restricting positions. As a result, it is possible to prevent the horizontal position of the substrate W from moving due to disturbance such as vibration of the apparatus and adversely affecting the next transport.

Figure 28:
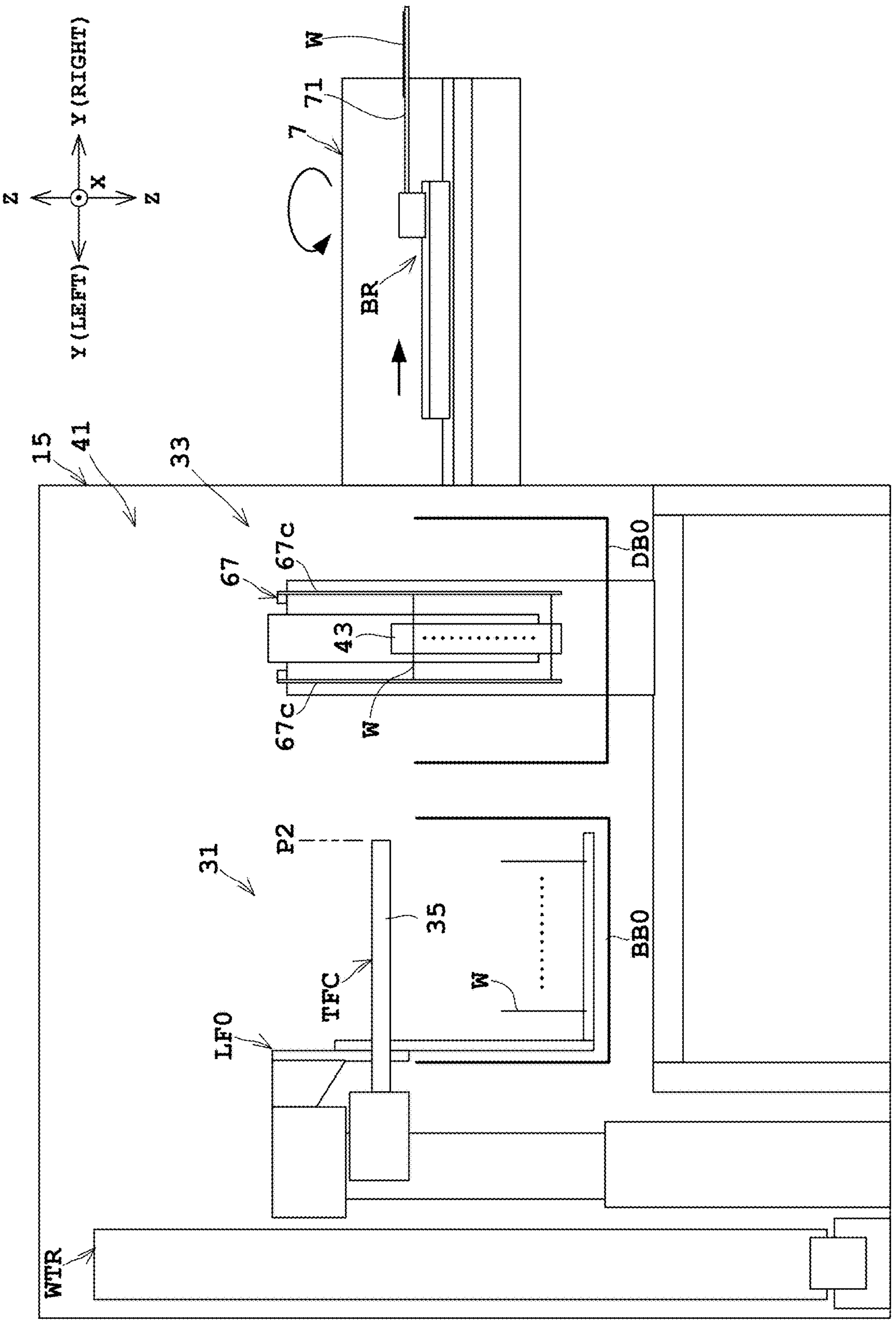
FIG. 28 is a view for explaining the operation of turning the posture of the substrate.

Refer to FIG. 28.

The bridge robot BR rotates the hand 71 to position the substrate W at the right side Y. Specifically, the hand 71 is rotated to move the substrate W toward the transfer unit 93. Then, one substrate W is transferred to the transfer unit 93.

By the operation of the posture turning block 15 described above, one substrate W is transported in a horizontal posture from the batch type processing apparatus 3 to the single wafer type processing apparatus 5.

The correspondence relationship between the present invention and the above-described embodiments is as follows.

The batch type processing apparatus 3 corresponds to a "batch type processing unit" in the present invention. The single wafer type processing apparatus 5 corresponds to a "single wafer type processing unit" in the present invention. The 25-piece chuck TFC corresponds to a "first transport unit" in the present invention. The bridge robot BR corresponds to a "second transport unit" in the present invention.

According to the present embodiment, the plurality of substrates W processed by the batch type processing apparatus 3 are transported to the posture turning unit 41 by the 25-piece chuck TFC, and then turned from the vertical posture to the horizontal posture by the posture turning unit 41. The plurality of substrates W turned to the horizontal posture are transferred one by one by the bridge robot BR, and then processed by the single wafer type processing apparatus 5. When the posture turning unit 41 turns the posture of the plurality of substrates W, the posture turning unit 41 holds the plurality of substrates W in a state where an interval above the upper surface of the plurality of substrates is narrow. Therefore, the plurality of substrates W can be stably held, and the posture can be stably turned. When transferring the plurality of substrates W in the horizontal posture, the posture turning unit 41 holds the plurality of substrates W in a state in which the interval US above the processing surface of the plurality of substrates W is wide. Therefore, the bridge robot BR can easily transfer each of the plurality of substrates W.

In addition, when the reversing chuck 43 receives the plurality of substrates W from the 25-piece chuck TFC, the reversing chuck 43 is set to the first interval WD1 by the drive mechanism 61 so that each of the plurality of substrates is accommodated in the first groove SL1. When the plurality of substrates W are rotated in the horizontal posture by the rotating mechanism 65, the reversing chuck 43 is set to the second interval WD2 by the drive mechanism 63 so that each of the plurality of substrates W is clamped between the second groove SL2. Therefore, movement of the substrates W in the thickness direction is restricted when turning the posture. As a result, the plurality of substrates W can be stably held, and the posture can be stably turned. When bridge robot BR receives the plurality of substrates W from the reversing chuck 43, the reversing chuck 43 is set to the first interval WD1 by the drive mechanism 63 so that the lower surfaces of the plurality of substrates W are abutted and supported by the first groove SL1. Therefore, when transferring the substrates W, the substrates W are allowed to move in the thickness direction. As a result, the bridge robot BR can scoop up and easily transfer each of the plurality of substrates W. The posture turning unit 41 can clamp or loosely hold the substrates W only by moving the reversing chuck 43 in the horizontal direction by the drive mechanism 63.

The present invention is not limited to the embodiment described above, but may be modified as follows.

(1) In the above-described embodiments, the reversing chuck 43 includes the first groove SL1 and the second groove SL2 on the front side and the depth side in the radial direction of the substrates W. However, the present invention is not limited to such a configuration. For example, an reversing chuck 43A as illustrated in FIGS. 29 and 30 may be used.

Figure 29:
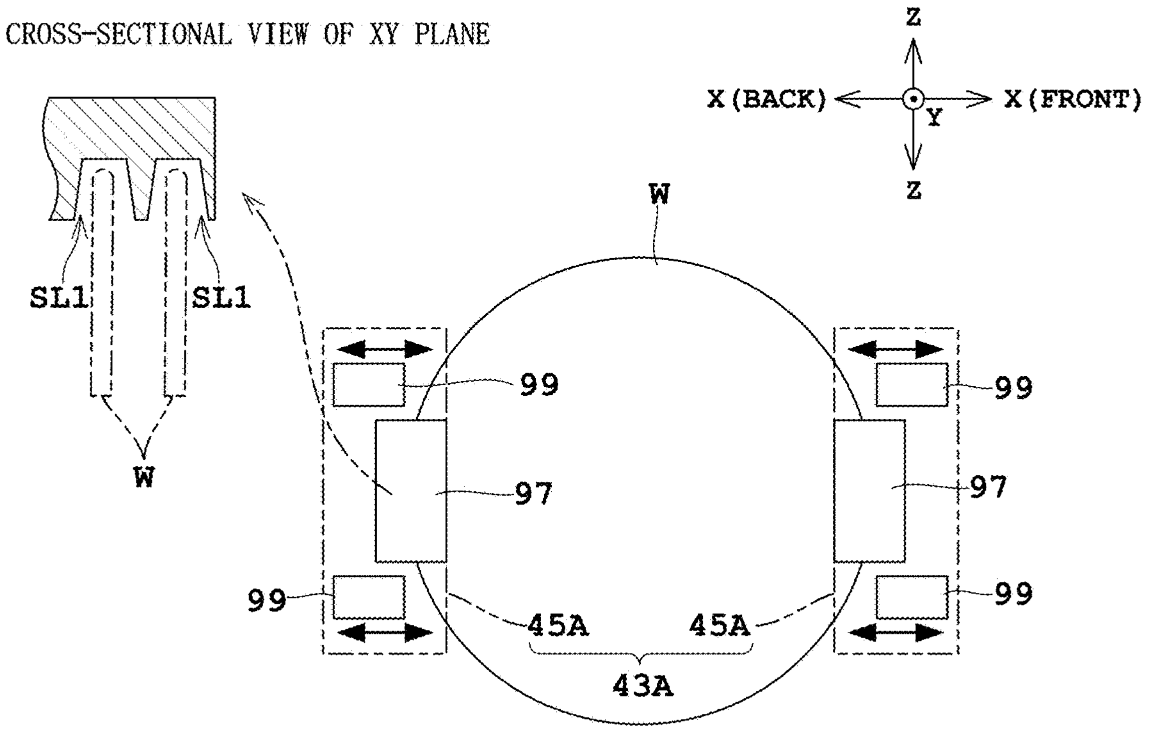
FIG. 29 is a view showing a modification of the reversing chuck and showing a state at the time of transfer.
Figure 30:
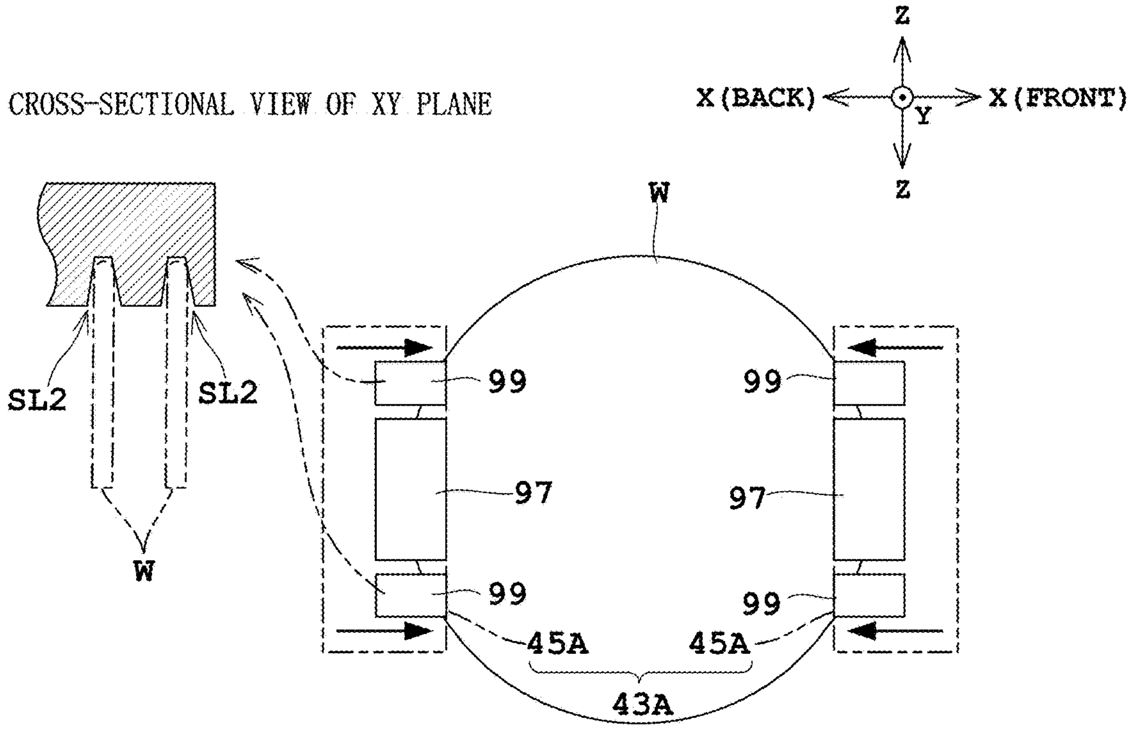
FIG. 30 is a view illustrating a modification of the reversing chuck and illustrating a state when a posture turn is performed.

FIG. 29 is a view showing a modification of the reversing chuck and showing a state at the time of transfer. FIG. 30 is a view illustrating a modification of the reversing chuck and illustrating a state when a posture turn is performed.

The reversing chuck 43A includes a pair of chuck members 45A. The chuck member 45A includes, for example, one first groove piece 97 and two second groove pieces 99. The first groove piece 97 includes the first groove SL1. The second groove piece 99 includes the second groove SL2. The second groove pieces 99 are arranged in the vertical direction Z of the first groove piece 97. The second groove pieces 99 are provided in the chuck member 45A so as to be able to move forward and backward in the front-back direction X in the center direction of the substrates W.

When receiving the substrates W, the reversing chuck 43A configured as described above moves the second groove pieces 99 away from the substrates W (FIG. 29). When the posture of the substrates W is turned, the second groove pieces 99 are moved so as to approach the center side of the substrates W (FIG. 30). Such an reversing chuck 43A may be adopted. With this configuration, while the above-described reversing chuck 43 has two stages of inclinations on the depth-side, the first groove piece 97 and the second groove pieces 99 only have the grooves SL1 and SL2 having one stage of inclinations. Therefore, there is an advantage that the chuck member 45A can be easily processed. In addition, in a case where the substrates W having different thicknesses are handled, only the second groove pieces 99 need to be replaced, and it is possible to flexibly cope with the standard of the substrate W.

(2) In the above-described embodiments, the reversing chuck 43, 43A has inclined surfaces corresponding to both surfaces of the substrate W. However, in a case where the batch lot is front and back surface matching (also referred to as back to face), the inclined surface may be provided only in a direction corresponding to the lower surface of the substrate W.

(3) In the above-described embodiments, the posture turning unit 41 turns the posture in a state where the plurality of substrates W are immersed in the immersion tank DB. However, the present invention is not limited to such a mode. That is, the posture turning unit 41 may turn the posture in a gas. Examples of the gas in this case include air and an inert gas.

(4) In the above-described embodiments, the alignment bar 67c includes the groove 67d, but the present invention does not require this configuration. The posture turning unit 41 does not necessarily need to include the alignment bar 67c.

(5) In the above-described embodiments, after the hand 71 of the bridge robot BR enters the reversing chuck 43, the alignment bar 67c at the receiving side is moved to the allowing position. However, in the present invention, the movement of the alignment bar 67c to the allowing position is not limited to this timing. That is, when the hand 71 enters the reversing chuck 43, the alignment bar 67c may be moved to the allowing position. As a result, even if the positional accuracy in the front-back direction X when the hand 71 enters the reversing chuck 43 is somewhat lowered, the hand 71 can be prevented from interfering with the alignment bar 67c. As a result, the control load can be suppressed.

(6) In the above-described embodiments, when the plurality of substrates W are received by the reversing chuck 43, the reversing chuck 43 is lowered from the receiving height HP1 to the clamping height HP2. However, the present invention is not limited to such a clamping method. For example, the plurality of substrates W may be received in a state where the chuck members 45 of the reversing chuck 43 are expanded, and then the interval between the chuck members 45 may be narrowed to clamp the plurality of substrates W.

(7) In the above-described embodiments, when the bridge robot BR receives the substrates W, the reversing chuck 43 moves downward. However, the present invention is not limited to such a mode. That is, the reversing chuck 43 may not move downward, and the hand 71 of the bridge robot BR may move upward to receive the substrates W. As a result, the control of the posture turning unit 41 can be simplified.

(8) In the above-described embodiments, the configuration in which the substrate processing apparatus 1 couples the batch type processing apparatus 3 and the single wafer type processing apparatus 5 by the bridging unit 7 has been described as an example. However, the present invention can also be applied to one substrate processing apparatus 1 including the batch type processing apparatus 3 and the single wafer type processing apparatus 5 in the same housing.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate processing apparatus that processes a substrate, the apparatus comprising:

a batch type processing unit that collectively processes a plurality of substrates in a vertical posture;

a single wafer type processing unit that processes one substrate in a horizontal posture;

a posture turning unit that turns a vertical posture to a horizontal posture of the plurality of substrates processed by the batch type processing unit;

a first transport unit that transports the plurality of substrates processed by the batch type processing unit to the posture turning unit; and a second transport unit that transports the plurality of substrates brought into a horizontal posture by the posture turning unit to the single wafer type processing unit, wherein the posture turning unit holds the plurality of substrates in a state where an interval above upper surfaces of the plurality of substrates in a second groove is narrower than a first groove when turning a posture of the plurality of substrates, and holds the plurality of substrates in a state where an interval above upper surfaces of the plurality of substrates in the first groove is wider than the second groove when transferring the plurality of substrates after the plurality of substrates are brought into a horizontal posture, the posture turning unit includes a reversing chuck that includes a pair of chuck members that are disposed to face each other in a radial direction of the plurality of substrates and clamp peripheral edge portions of the plurality of substrates, a drive mechanism that moves the reversing chuck in a horizontal direction over at least two positions of a first interval for transferring the plurality of substrates between the first transport unit and the second transport unit and a second interval that is narrower than the first interval and where the plurality of substrates are clamped, and a rotating mechanism that rotates the reversing chuck in a plane direction of the plurality of substrates, the reversing chuck includes a first groove that allows the plurality of substrates to move in a thickness direction, and a second groove formed on an outer side of the plurality of substrates than an outer end of the first groove in the radial direction of the plurality of substrates and clamps the plurality of substrates in a radial direction while restricting movement of the plurality of substrates in a thickness direction, when the reversing chuck receives the plurality of substrates from the first transport unit, the reversing chuck is set to the first interval by the drive mechanism so that each of the plurality of substrates is accommodated in the first groove, when the plurality of substrates are rotated in a horizontal posture by the rotating mechanism, the reversing chuck is set to the second interval by the drive mechanism so that each of the plurality of substrates is clamped in the second groove, and when the second transport unit receives the plurality of substrates from the reversing chuck, the reversing chuck is set to the first interval by the drive mechanism so that the lower surfaces of the plurality of substrates are abutted and supported by the first groove.

2. The substrate processing apparatus according to claim 1, wherein the second groove includes a top portion where end surfaces of the plurality of substrates are positioned, and a depth-side inclined surface that widens from the top portion toward a center side of the plurality of substrates, and the first groove has an opening on the center side of the plurality of substrates, and has a front-side inclined surface that widens from the depth-side inclined surface toward the opening.

3. The substrate processing apparatus according to claim 2, wherein the depth-side inclined surface and the front-side inclined surface have inclined surfaces at positions facing front and back surfaces of the plurality of substrates.

4. The substrate processing apparatus according to claim 2, wherein the front-side inclined surface is inclined more gently than the depth-side inclined surface.

5. The substrate processing apparatus according to claim 1, wherein the posture turning unit further includes an alignment bar movable between a restricting position where the movement of the plurality of substrates in the horizontal direction is restricted and an allowing position where the movement of the plurality of substrates in the horizontal direction is allowed in a state where the plurality of substrates are brought into the horizontal posture by the reversing chuck, and the posture turning unit moves the alignment bar to the restricting position until the reversing chuck is expanded from the second interval to the first interval.

6. The substrate processing apparatus according to claim 5, wherein the alignment bar is provided at a side where the second transport unit receives the plurality of substrates and at an opposite side of a receiving side with the plurality of substrates interposed therebetween in plan view.

7. The substrate processing apparatus according to claim 6, wherein when the second transport unit receives the plurality of substrates from the reversing chuck after the reversing chuck has been expanded from the second interval to the first interval, an alignment bar at the receiving side among the alignment bars moves to the allowing position.

8. The substrate processing apparatus according to claim 5, wherein the alignment bar is formed with a plurality of grooves corresponding to positions of end surfaces of the plurality of substrates.

9. The substrate processing apparatus according to claim 1, further comprising a lifting mechanism that moves the reversing chuck up and down, wherein when the second transport unit receives the plurality of substrates from the reversing chuck, the second transport unit moves the reversing chuck down by the lifting mechanism.

10. The substrate processing apparatus according to claim 9, wherein when the first transport unit transfers the plurality of substrates to the reversing chuck, the reversing chuck has been set to the first interval, the lifting mechanism moves the reversing chuck down from a receiving height that is higher than an upper edge of the plurality of substrates transported by the first transport unit to a clamping height that is lower than the upper edges of the plurality of substrates.

* * * * *